US012615780B2

(12) United States Patent
Hamanaka

(10) Patent No.: US 12,615,780 B2
(45) Date of Patent: Apr. 28, 2026

(54) SEMICONDUCTOR DEVICE

(71) Applicant: Kioxia Corporation, Tokyo (JP)

(72) Inventor: Hironobu Hamanaka, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 666 days.

(21) Appl. No.: 17/807,949

(22) Filed: Jun. 21, 2022

(65) Prior Publication Data

US 2023/0255029 A1 Aug. 10, 2023

(30) Foreign Application Priority Data

Feb. 9, 2022 (JP) ................................. 2022-018678

(51) Int. Cl.
| | |
|---|---|
| *H10B 43/35* | (2023.01) |
| *H10B 41/27* | (2023.01) |
| *H10B 41/35* | (2023.01) |
| *H10B 41/40* | (2023.01) |
| *H10B 43/27* | (2023.01) |
| *H10B 43/40* | (2023.01) |

(52) U.S. Cl.
CPC ............. *H10B 43/35* (2023.02); *H10B 41/27* (2023.02); *H10B 41/35* (2023.02); *H10B 41/40* (2023.02); *H10B 43/27* (2023.02); *H10B 43/40* (2023.02)

(58) Field of Classification Search
CPC ........ H10B 41/27; H10B 41/35; H10B 41/40; H10B 43/27; H10B 43/35; H10B 43/40
See application file for complete search history.

(56) References Cited

U.S. PATENT DOCUMENTS

| | | | |
|---|---|---|---|
| 2016/0225714 A1* | 8/2016 | Yun ........................ | H10B 43/27 |
| 2017/0186732 A1 | 6/2017 | Chu et al. | |
| 2018/0175012 A1 | 6/2018 | Wu et al. | |
| 2019/0131255 A1 | 5/2019 | Teng et al. | |
| 2019/0164914 A1 | 5/2019 | Hu et al. | |
| 2019/0363079 A1 | 11/2019 | Thei et al. | |
| 2020/0203329 A1* | 6/2020 | Kanamori .............. | H10D 88/00 |
| 2020/0372956 A1* | 11/2020 | Nam ................... | H01L 25/0657 |
| 2021/0202458 A1* | 7/2021 | Jung ........................ | H01L 24/29 |
| 2022/0028804 A1 | 1/2022 | Mitsuhashi et al. | |
| 2022/0037268 A1 | 2/2022 | Shen et al. | |

FOREIGN PATENT DOCUMENTS

JP 2020-92146 A 6/2020

* cited by examiner

*Primary Examiner* — Dmitriy Yemel Yanov
(74) *Attorney, Agent, or Firm* — Oblon, McClelland, Maier & Neustadt, L.L.P.

(57) ABSTRACT

According to an embodiment, a semiconductor device includes a substrate including an element region and a first region surrounding the element region, a surface protective layer provided in the element region and a part of the first region, a first semiconductor layer at least a part of which is arranged in a second region not provided with the surface protective layer in the first region, and a first conductor provided in the first region, surrounding the element region, arranged between the substrate and the first semiconductor layer in a first direction, and including one end in contact with the first semiconductor layer. The first conductor is electrically coupled to the substrate.

20 Claims, 19 Drawing Sheets

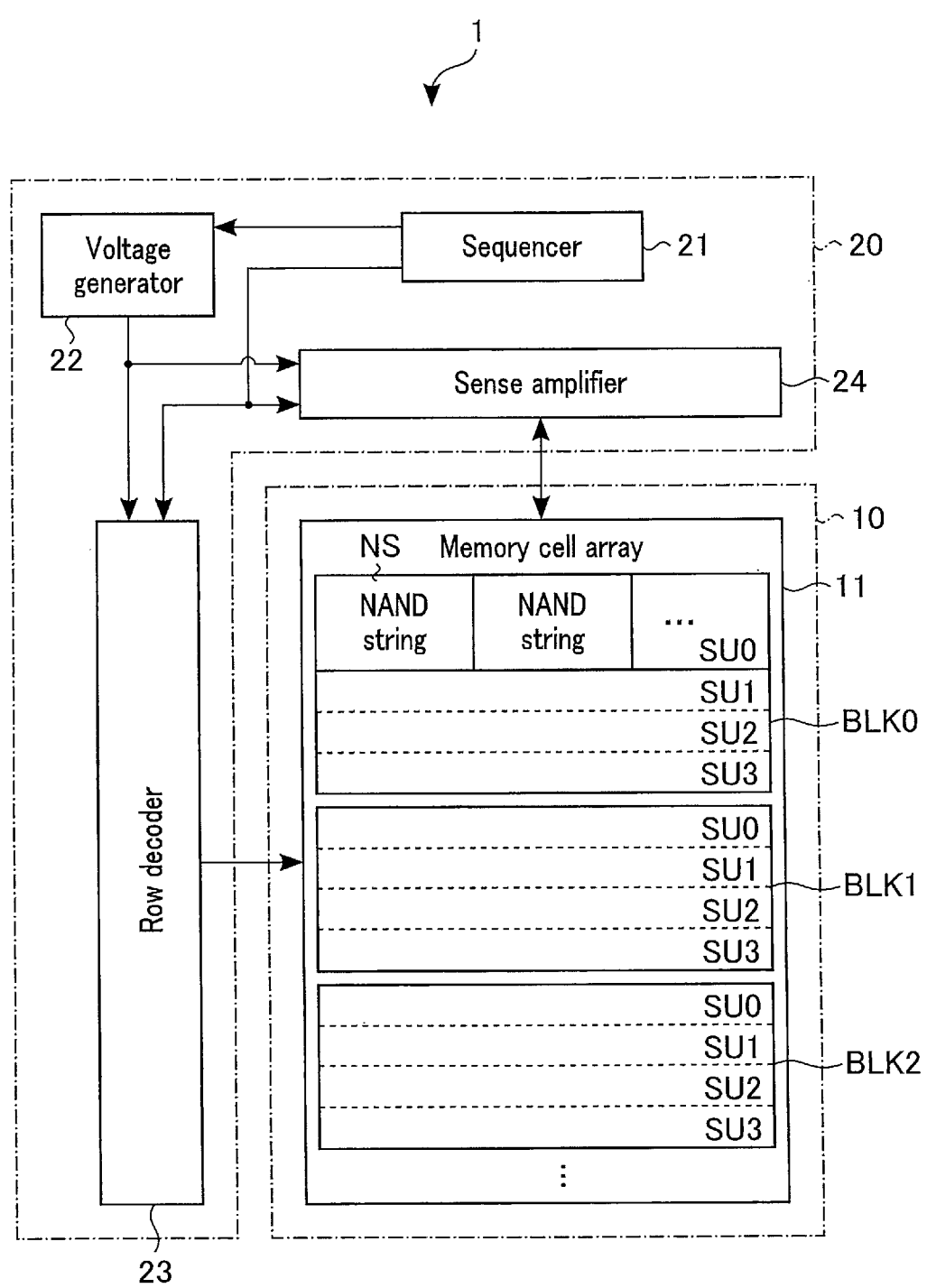
F I G. 1

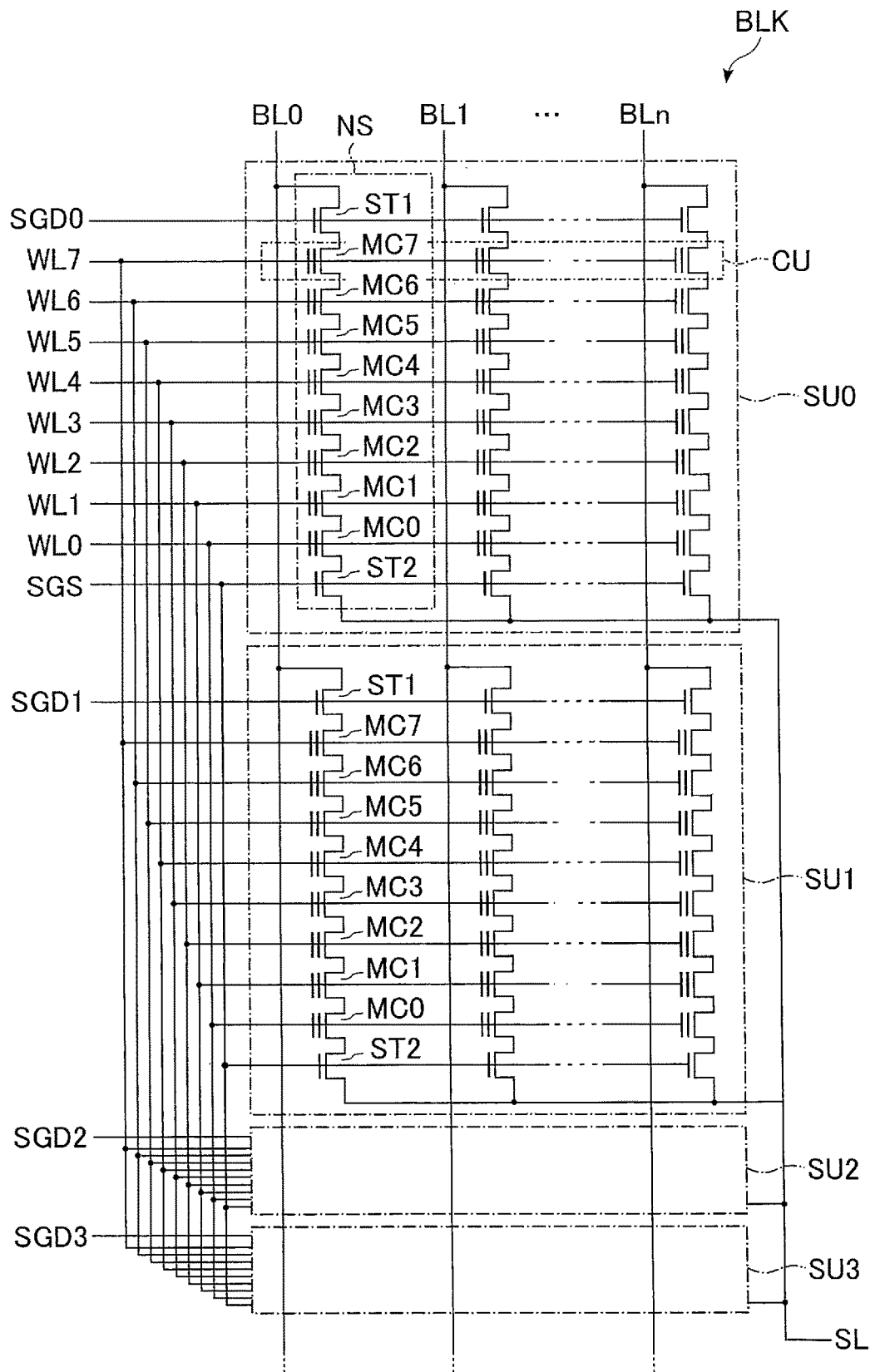
F I G. 2

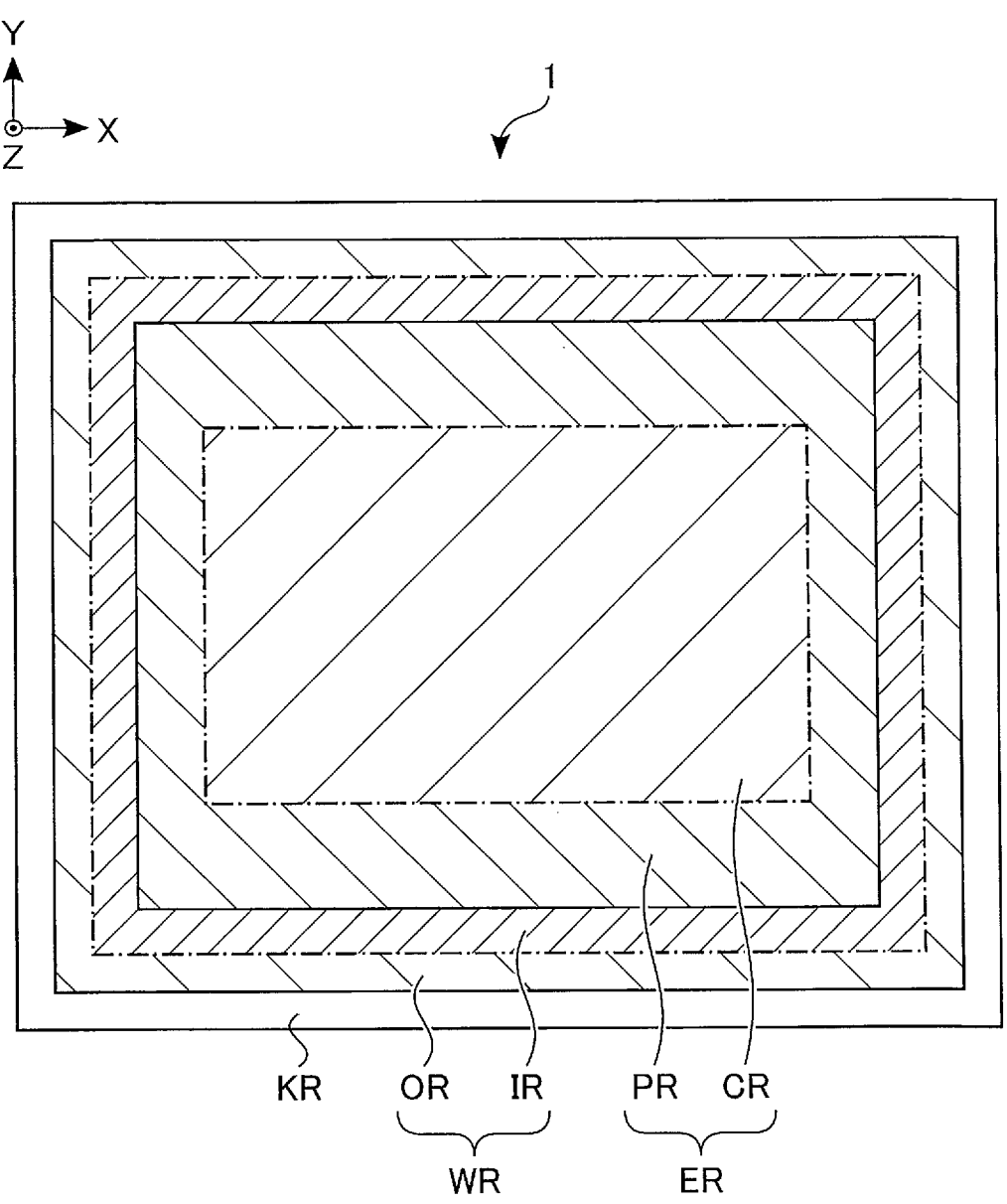
F I G. 3

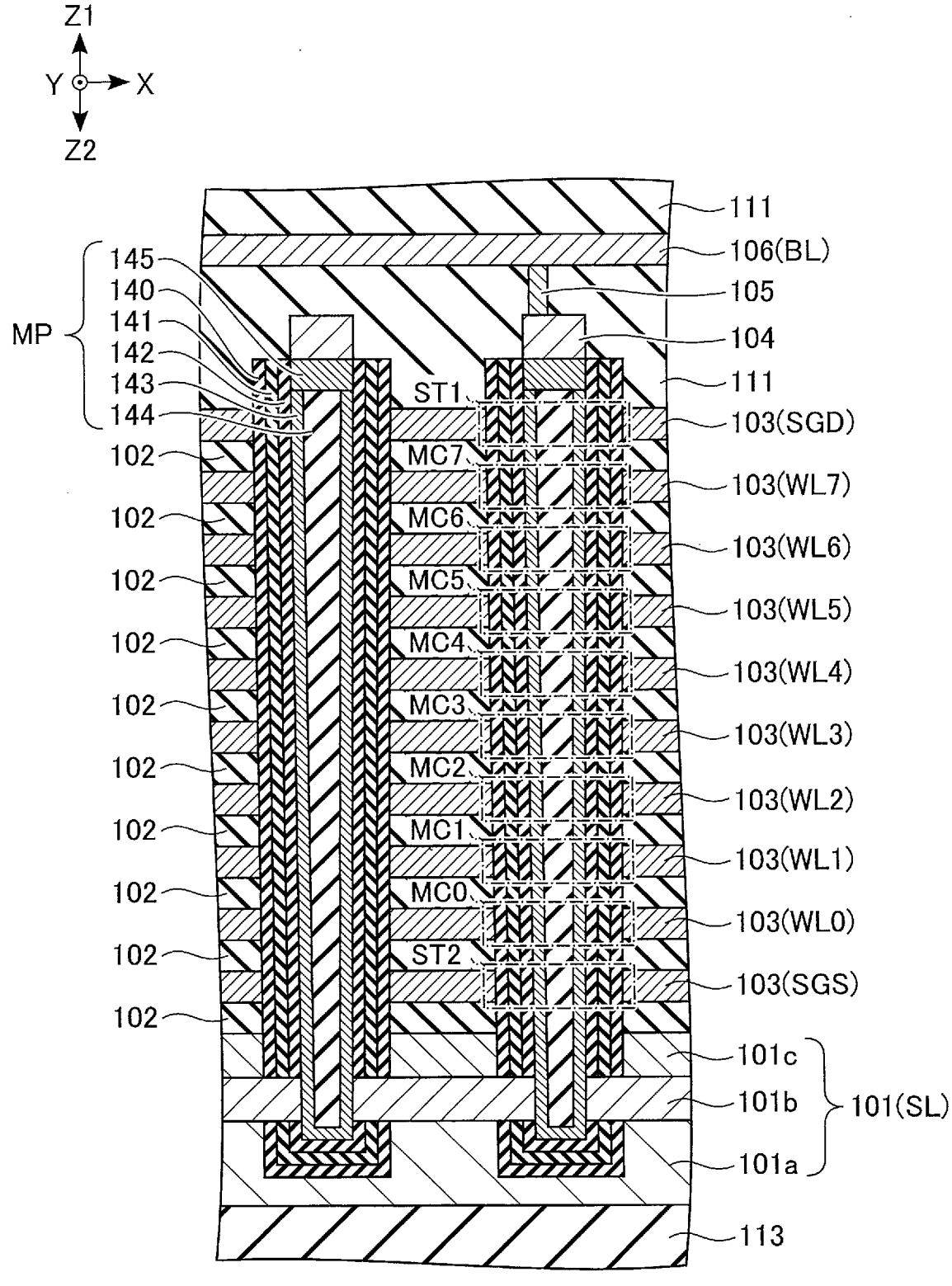
F I G. 5

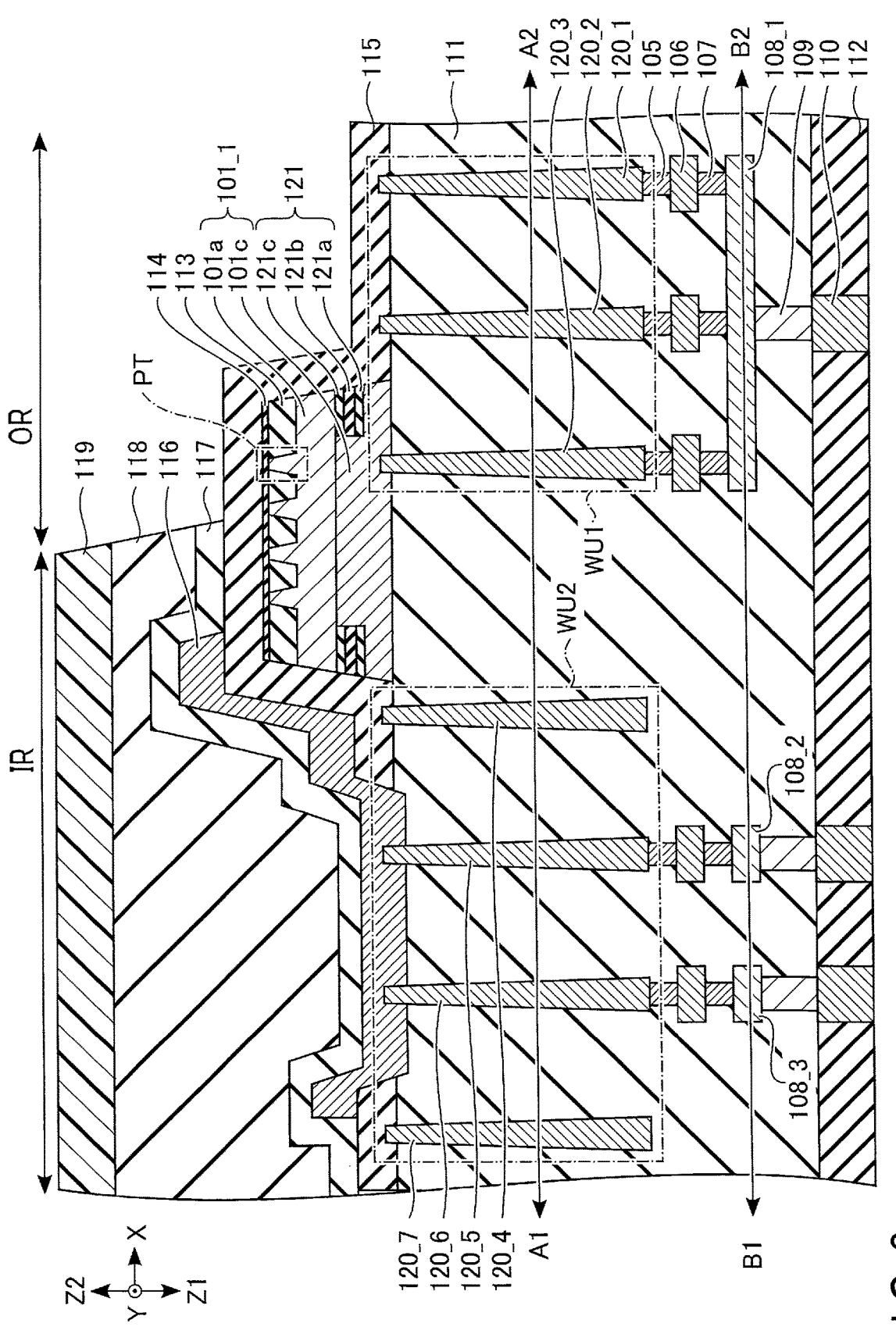
F I G. 6

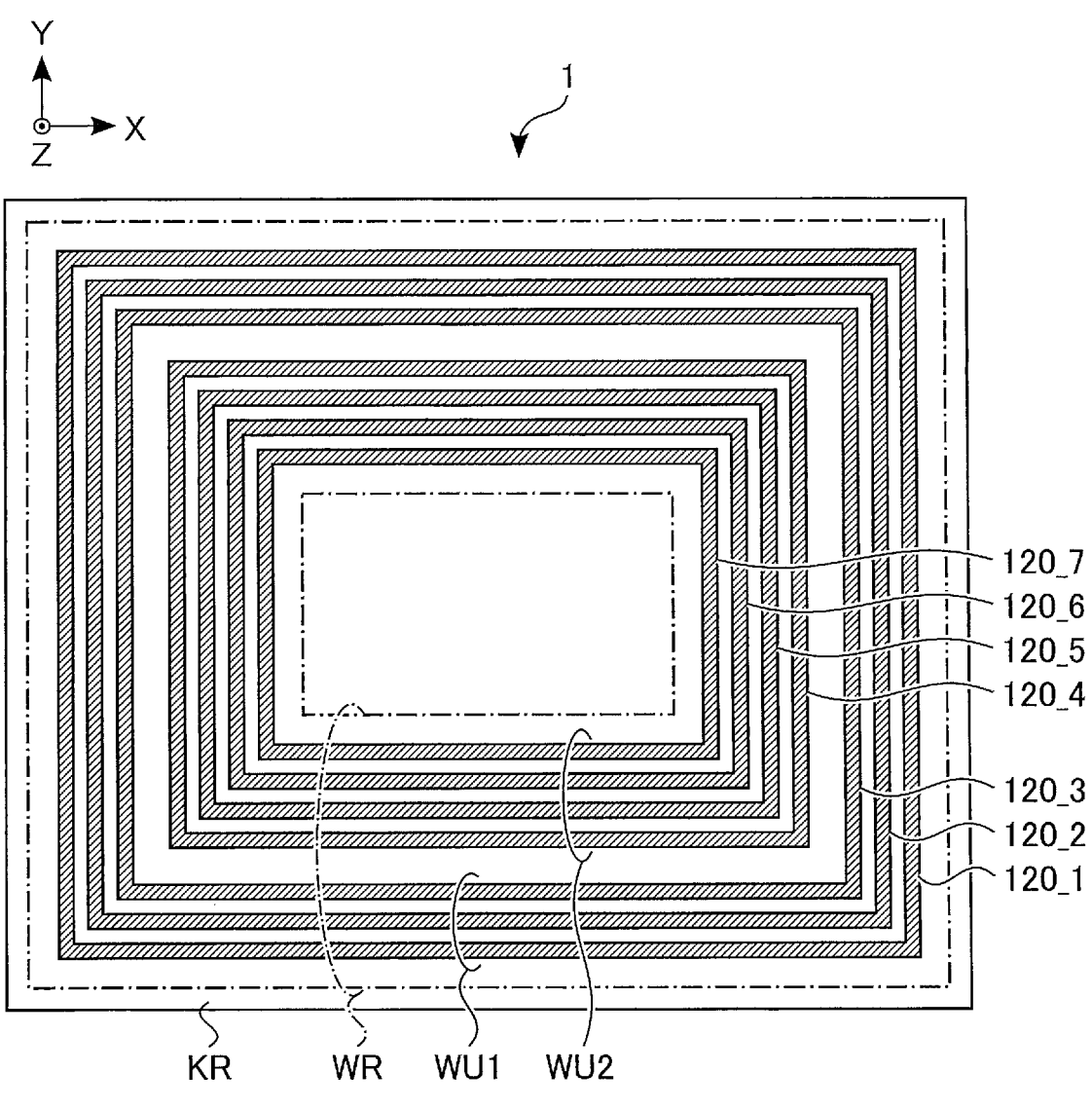
F I G. 7

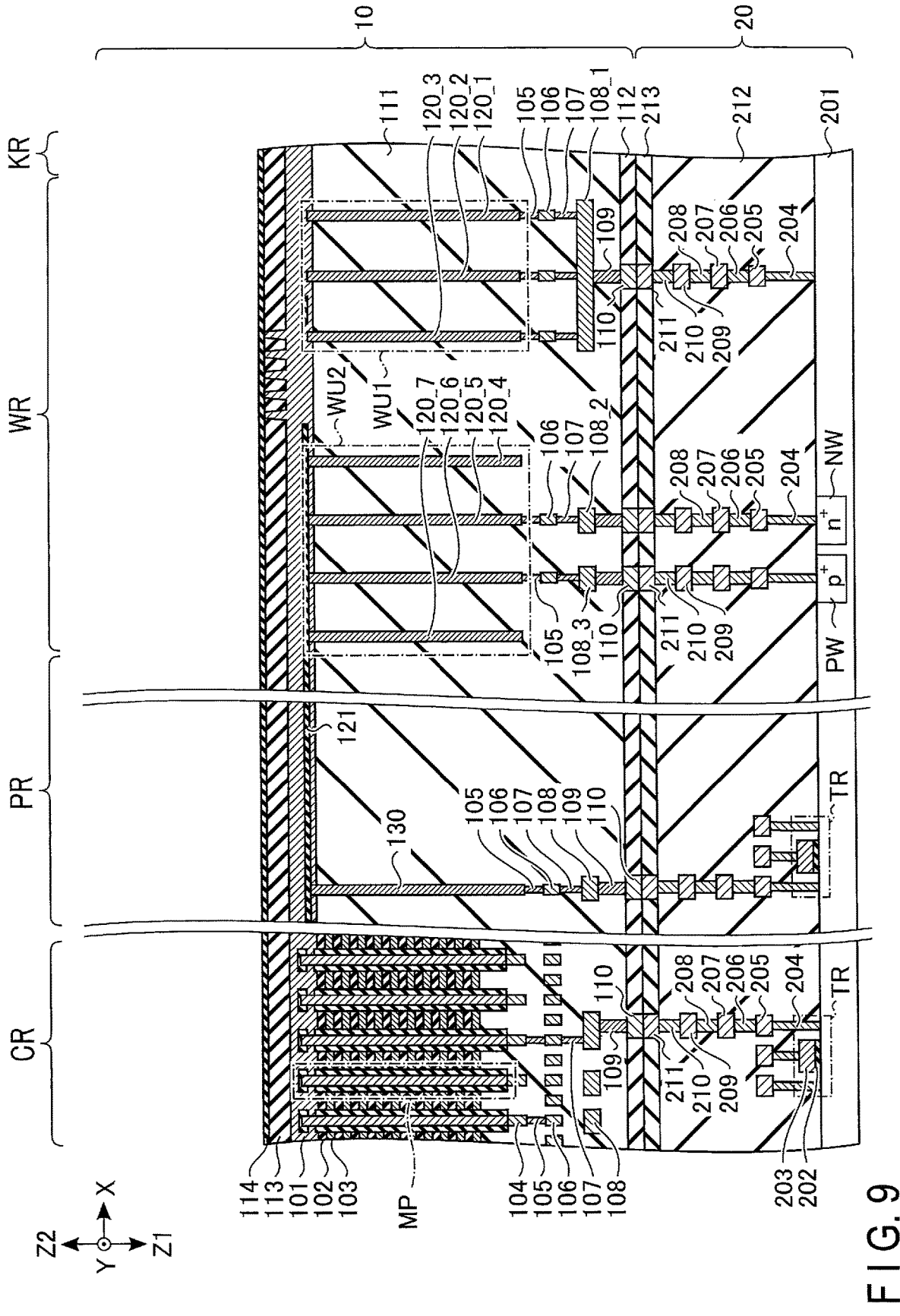
F I G. 9

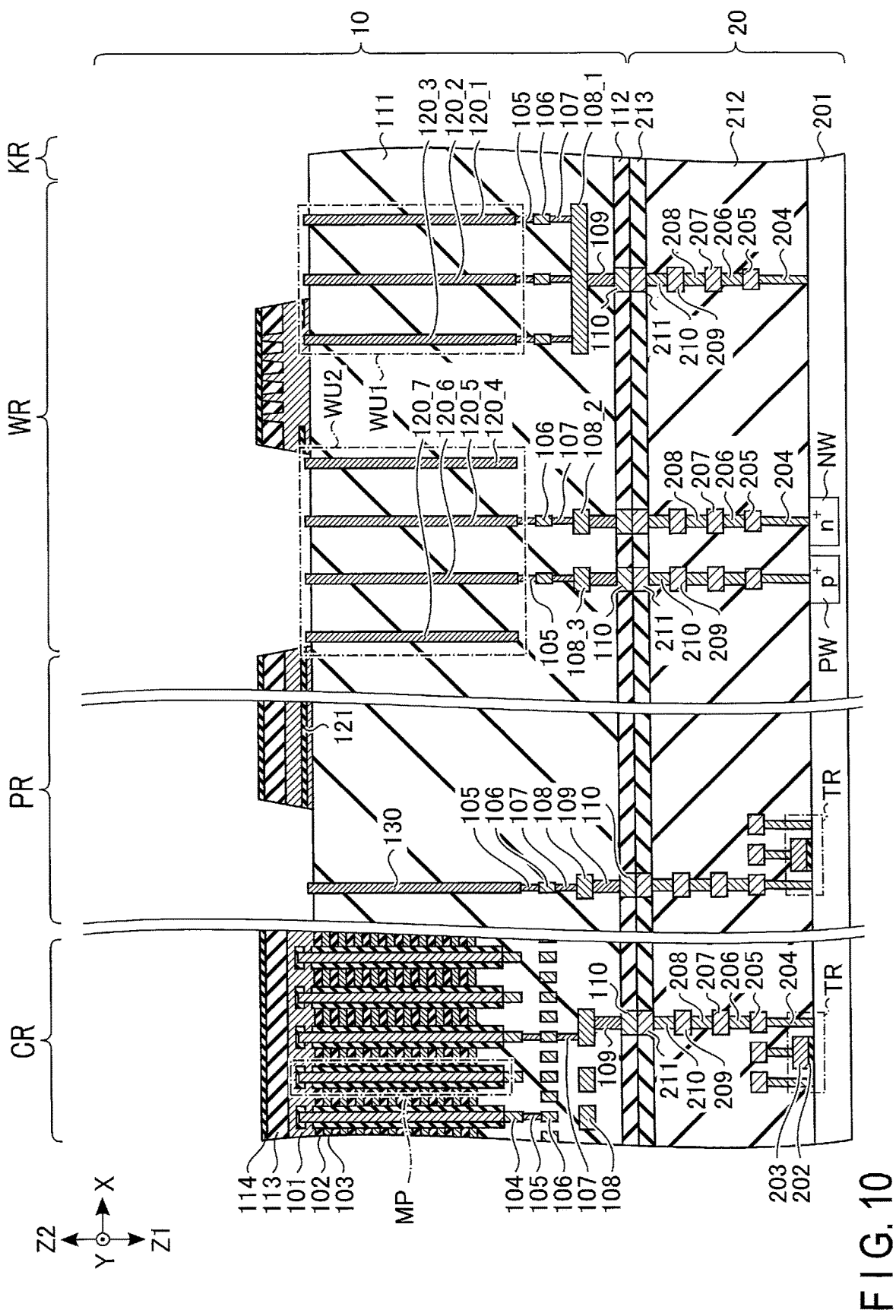
F I G. 10

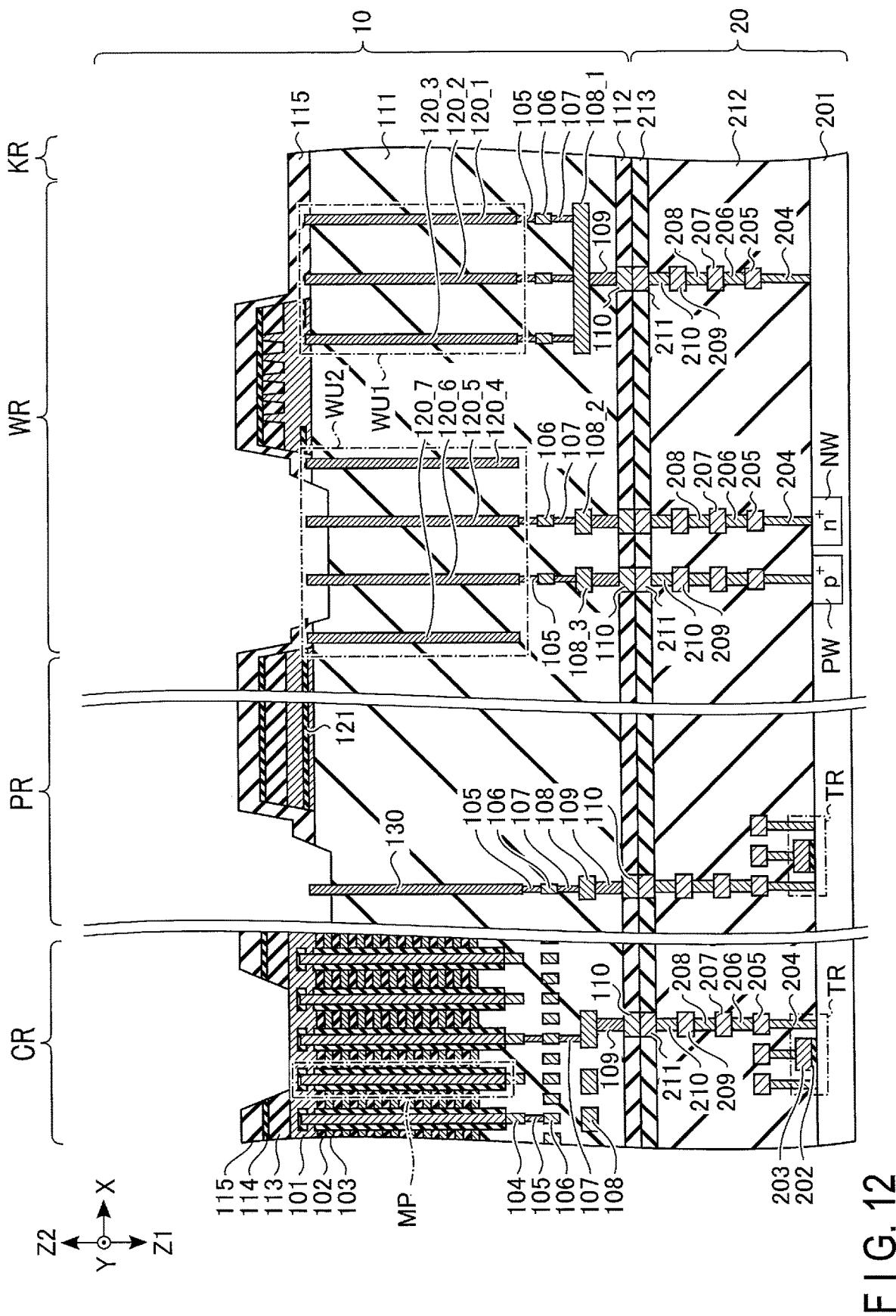
F I G. 12

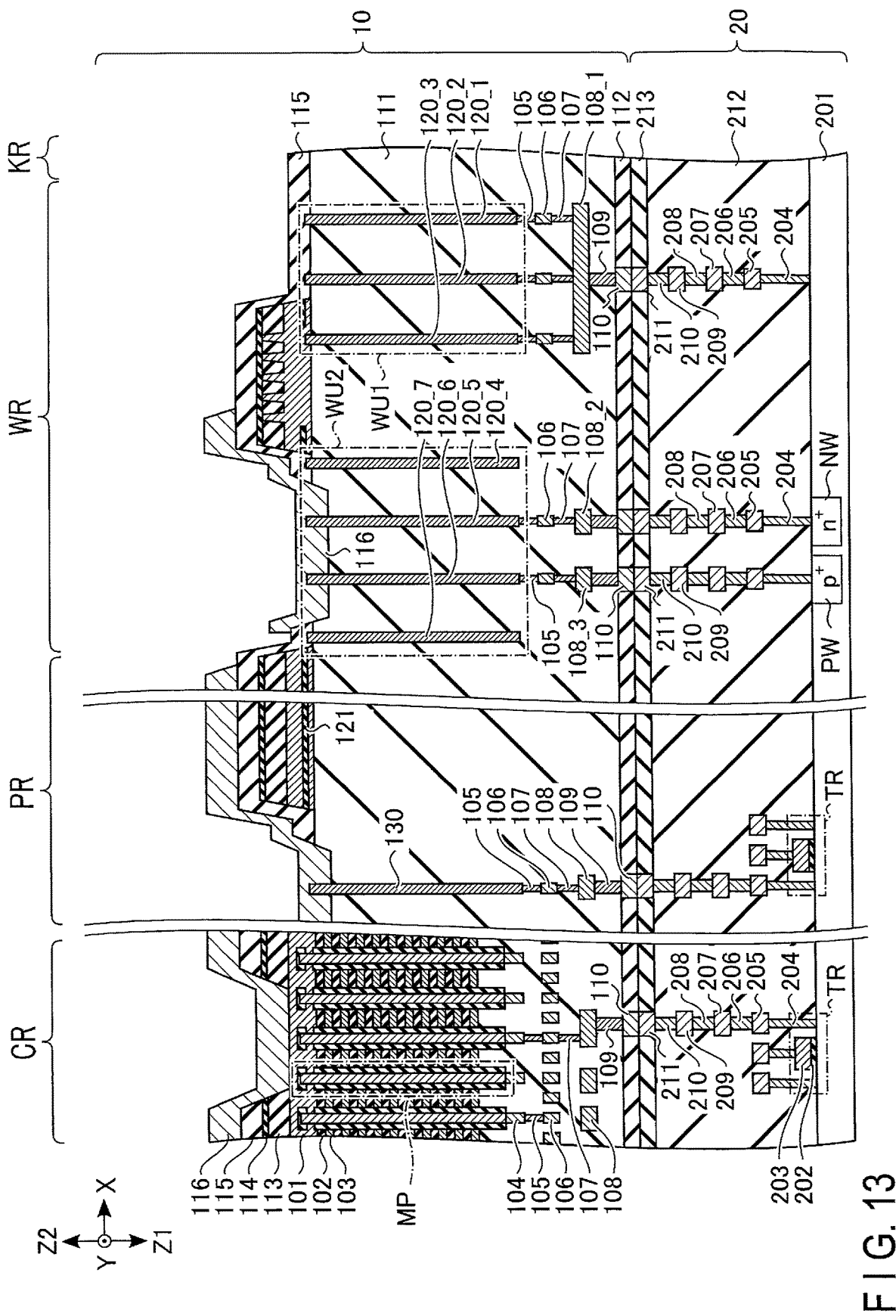
F I G. 13

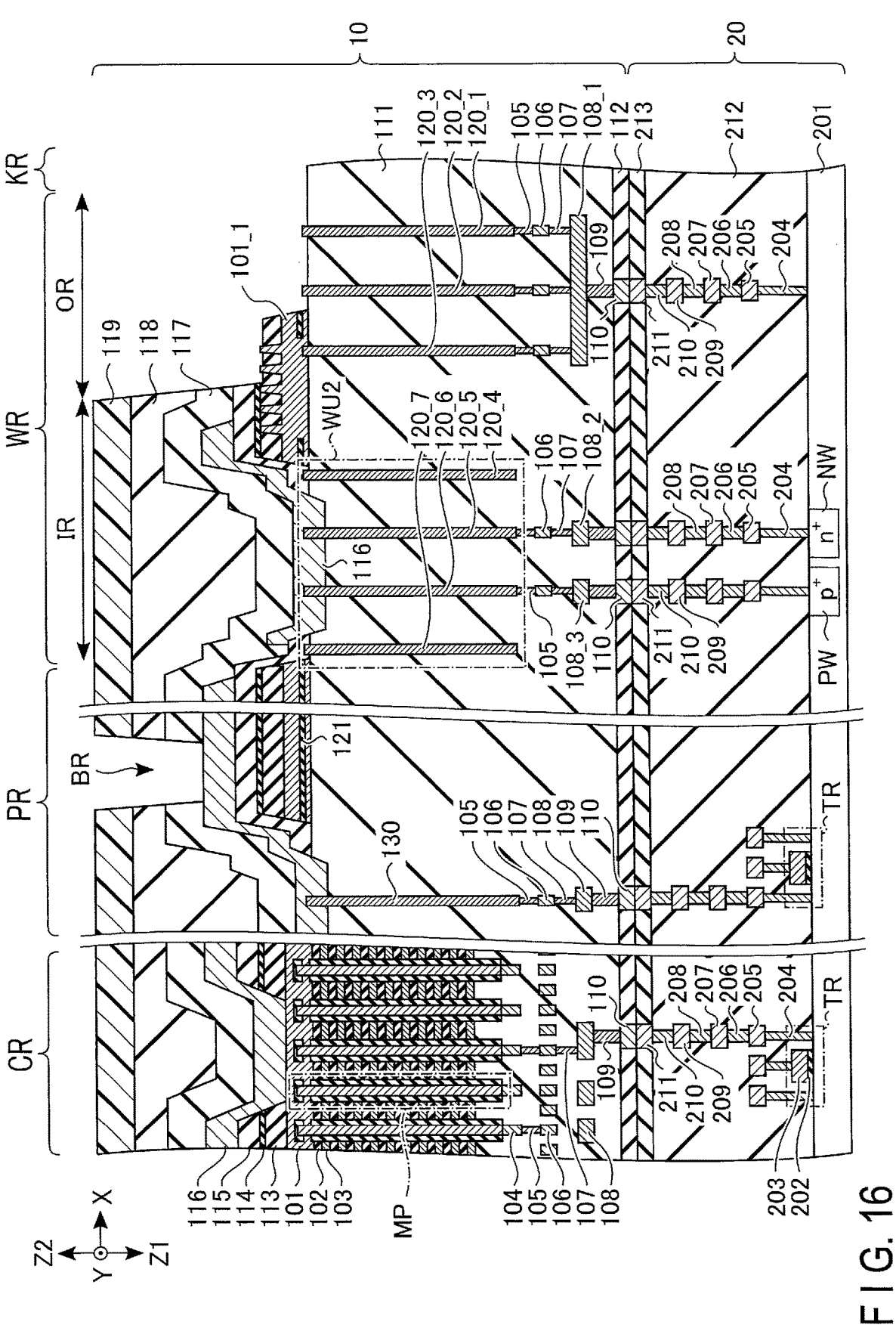
F I G. 16

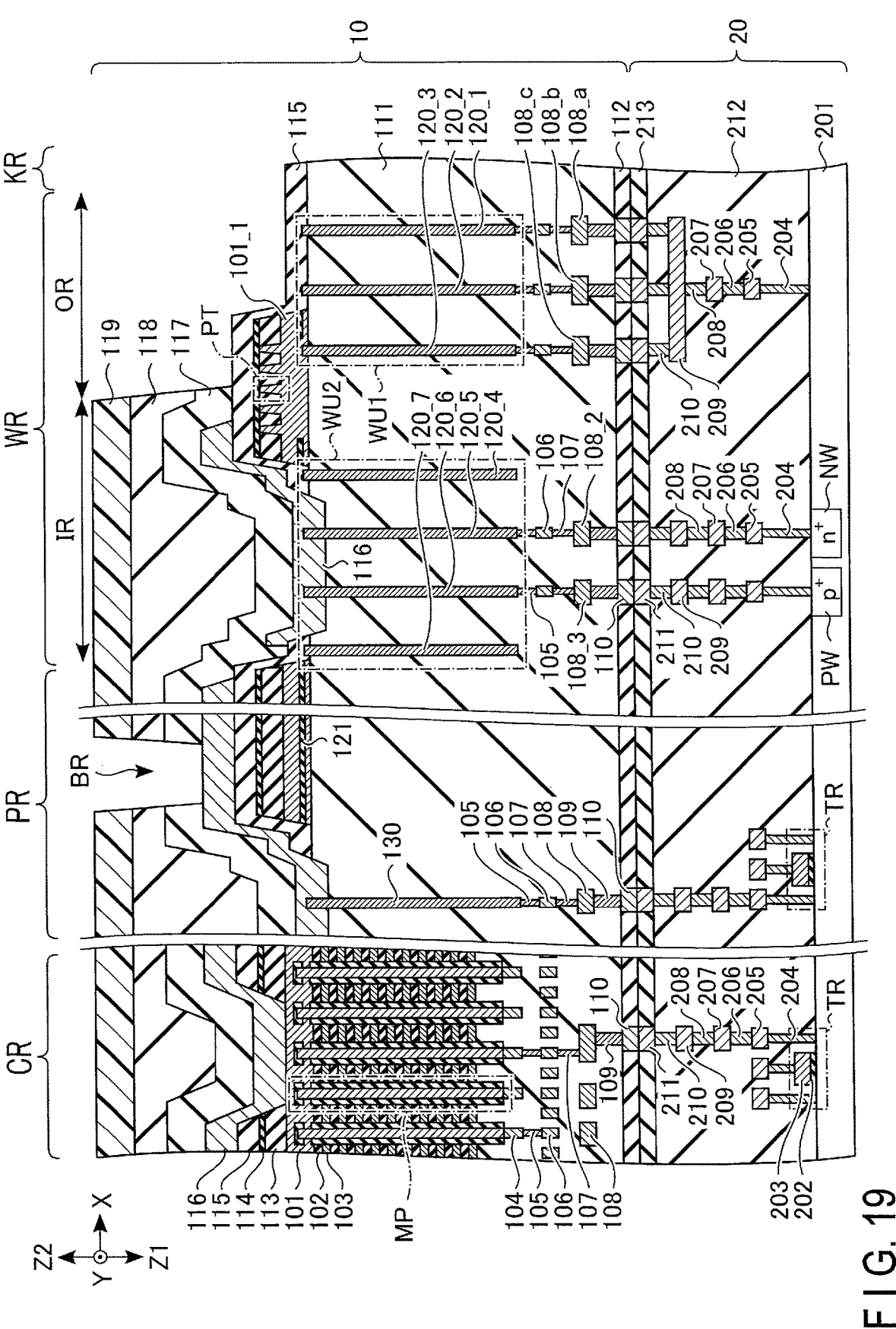
F I G. 19

SEMICONDUCTOR DEVICE

CROSS-REFERENCE TO RELATED APPLICATIONS

This application is based upon and claims the benefit of priority from Japanese Patent Application No. 2022-018678, filed Feb. 9, 2022, the entire contents of which are incorporated herein by reference.

FIELD

Embodiments described herein relate generally to a semiconductor device.

BACKGROUND

A NAND flash memory is known as a semiconductor device.

BRIEF DESCRIPTION OF THE DRAWINGS

FIG. 1 is a block diagram showing an overall configuration of a semiconductor device according to a first embodiment.

FIG. 2 is a circuit diagram of a memory cell array included in the semiconductor device according to the first embodiment.

FIG. 3 is a plan view of the semiconductor device according to the first embodiment.

FIG. 5 is a cross-sectional view of the memory cell array included in the semiconductor device according to the first embodiment.

FIG. 6 is a cross-sectional view of wall units WU1 and WU2 included in the semiconductor device according to the first embodiment.

FIG. 7 is a plan view of conductors 120 along line A1-A2 of FIG. 6.

FIG. 9 is a cross-sectional view showing a manufacturing process of the semiconductor device according to the first embodiment.

FIG. 10 is a cross-sectional view showing a manufacturing process of the semiconductor device according to the first embodiment.

FIG. 12 is a cross-sectional view showing a manufacturing process of the semiconductor device according to the first embodiment.

FIG. 13 is a cross-sectional view showing a manufacturing process of the semiconductor device according to the first embodiment.

FIG. 16 is a cross-sectional view showing a manufacturing process of the semiconductor device according to the first embodiment.

FIG. 19 is a cross-sectional view of a semiconductor device according to a second example of the second embodiment.

DETAILED DESCRIPTION

Figure 4:
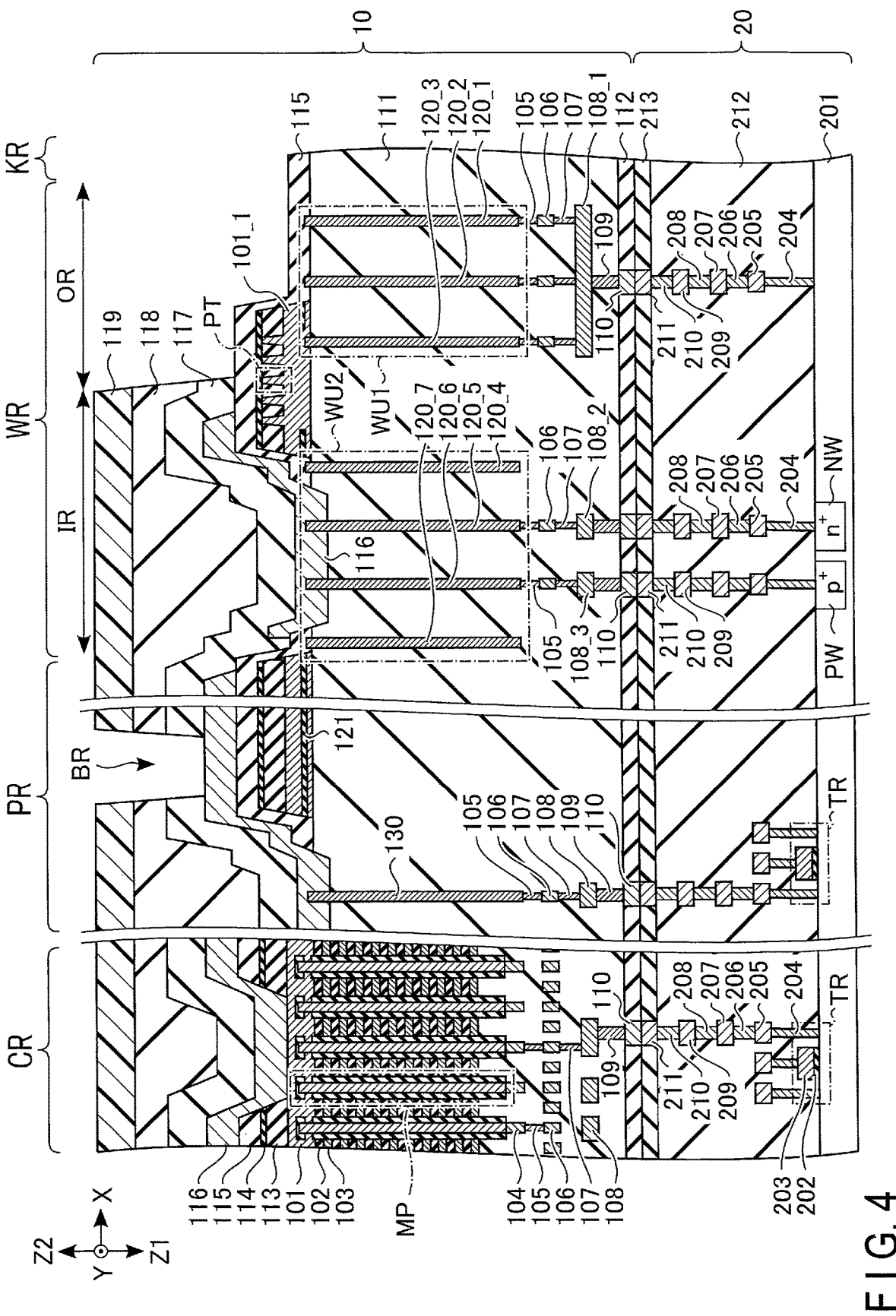
FIG. 4 is a cross-sectional view of the semiconductor device according to the first embodiment.

In general, according to one embodiment, a semiconductor device includes: a substrate including an element region and a first region surrounding the element region; a surface protective layer provided in the element region and a part of the first region; a first semiconductor layer at least a part of which is arranged in a second region, the second region being included in the first region and not provided with the surface protective layer; and a first conductor provided in the first region, surrounding the element region, arranged between the substrate and the first semiconductor layer in a first direction, and including one end in contact with the first semiconductor layer. The first conductor is electrically coupled to the substrate.

Embodiments will be described below with reference to the accompanying drawings. The description provided hereinafter use the same reference sign for components having approximately the same function and configuration. A repeat description may be omitted when unnecessary. The embodiments to be described below are to give examples of devices and methods that realize technical ideas of the embodiment. The technical ideas of the embodiment do not limit the materials, shapes, structures, arrangements, etc. of the structural components to the ones to be described below. Various modifications may be made to the technical ideas of the embodiments without departing from the spirit of the invention. The embodiments and modifications are included in the scope of the claimed inventions and their equivalents.

1. First Embodiment

A semiconductor device according to a first embodiment will be described. As an example of the semiconductor device, a three-dimensionally stacked NAND flash memory, in which memory cell transistors are three-dimensionally stacked on a semiconductor substrate, will be described below.

1.1 Configuration 1.1.1 Overall Configuration of Semiconductor Device

First, an example of an overall configuration of a semiconductor device 1 will be described with reference to FIG. 1. FIG. 1 is a block diagram showing an overall configuration of the semiconductor device 1. In FIG. 1, some of the couplings between the structural elements are indicated by arrows; however, the couplings between the structural elements are not limited thereto.

The semiconductor device 1 is, for example, a three-dimensionally stacked NAND flash memory. The three-dimensionally stacked NAND flash memory includes a plurality of non-volatile memory cell transistors arranged three-dimensionally on a semiconductor substrate.

As shown in FIG. 1, the semiconductor device 1 includes an array chip 10 and a circuit chip 20. The array chip 10 is a chip in which an array of the non-volatile memory cell transistors is provided. The circuit chip 20 is a chip in which circuits that control the array chip 10 are provided. The semiconductor device 1 of the present embodiment is formed by bonding the array chip 10 and the circuit chip 20. Hereinafter, the array chip 10 and the circuit chip 20 will each be simply referred to as a "chip" unless otherwise specified. A plurality of array chips 10 may be provided.

The array chip 10 includes one or more memory cell arrays 11. The memory cell array 11 is a region in which the non-volatile memory cell transistors are arranged three-dimensionally. In the example of FIG. 1, the array chip 10 includes one memory cell array 11.

The circuit chip 20 includes a sequencer 21, a voltage generator 22, a row decoder 23, and a sense amplifier 24.

The sequencer 21 is a control circuit of the semiconductor device 1. For example, the sequencer 21 is coupled to the voltage generator 22, the row decoder 23, and the sense amplifier 24. Then, the sequencer 21 controls the voltage generator 22, the row decoder 23, and the sense amplifier 24. In addition, the sequencer 21 controls the operation of the entire semiconductor device 1 based on control of an external controller. More specifically, the sequencer 21 executes a write operation, a read operation, an erase operation, etc.

The voltage generator 22 is a circuit that generates voltages to be used for the write operation, read operation, erase operation, etc. For example, the voltage generator 22 is coupled to the row decoder 23 and the sense amplifier 24. The voltage generator 22 supplies the generated voltages to the row decoder 23, the sense amplifier 24, etc.

The row decoder 23 is a circuit that decodes a row address. The row address is an address signal for designating interconnects in a row direction in the memory cell array 11. The row decoder 23 supplies the memory cell array 11 with the voltages applied from the voltage generator 22 based on a result of decoding the row address.

The sense amplifier 24 is a circuit that writes and reads data. In a read operation, the sense amplifier 24 senses data read from the memory cell array 11. In a write operation, the sense amplifier 24 supplies the memory cell array 11 with voltages corresponding to write data.

Next, an internal configuration of the memory cell array 11 will be described. The memory cell array 11 includes a plurality of blocks BLK. The block BLK is, for example, a set of a plurality of memory cell transistors whose data is erased in a batch. The plurality of memory cell transistors in the block BLK are respectively associated with rows and columns. In the example of FIG. 1, the memory cell array 11 includes blocks BLK0, BLK1, and BLK2.

Each block BLK includes a plurality of string units SU. Each string unit SU is, for example, a set of a plurality of NAND strings which are selected in a batch in a write operation or a read operation. Each NAND string includes a set of a plurality of memory cell transistors coupled in series. In the example of FIG. 1, each block BLK includes four string units SU0 to SU3. The number of blocks BLK in the memory cell array 11 and the number of string units SU in each of the blocks BLK are freely selected.

1.1.2 Circuit Configuration of Memory Cell Array

Next, an example of a circuit configuration of the memory cell array 11 will be described with reference to FIG. 2. FIG. 2 is a circuit diagram of the memory cell array 11. The example of FIG. 2 shows a circuit configuration of a single block BLK.

As shown in FIG. 2, each string unit SU includes a plurality of NAND strings NS.

Each of the NAND strings NS includes a plurality of memory cell transistors MC and select transistors ST1 and ST2. In the example of FIG. 2, each NAND string NS includes eight memory cell transistors MC0 to MC7. The number of memory cell transistors MC is freely selected.

Each of the memory cell transistors MC is a memory element that stores data in a nonvolatile manner. Each of the memory cell transistors MC includes a control gate and a charge storage layer. Each of the memory cell transistors MC may be of a metal-oxide-nitride-oxide-silicon (MONOS) type or may be of a floating gate (FG) type. The MONOS type uses an insulating layer as a charge storage layer. The FG type uses a conductor as a charge storage layer. Hereinafter, the case in which the memory cell transistors MC are of the MONOS type will be described.

The select transistors ST1 and ST2 are switching elements. The select transistors ST1 and ST2 are respectively used to select a string unit SU in various operations. The number of select transistors ST1 and ST2 is freely selected. It suffices that each NAND string NS contains one or more select transistors ST1 and one or more select transistors ST2.

In each NAND string NS, current paths of the select transistor ST2, the memory cell transistors MC0 to MC7, and the select transistor ST1 are coupled in series. The drain of the select transistor ST1 is coupled to a corresponding bit line BL. The source of the select transistor ST2 is coupled to a source line SL.

The memory cell transistors MC0 to MC7 included in the same block BLK have their control gates coupled in common to word lines WL0 to WL7, respectively. More specifically, for example, the block BLK includes four string units SU0 to SU3. Then, each string unit SU includes a plurality of memory cell transistors MC0. The plurality of memory cell transistors MC0 in the same block BLK have their control gates coupled in common to the single word line WL0. The same applies to the memory cell transistors MCi to MC7.

A plurality of select transistors ST1 in a string unit SU have their gates coupled in common to a single select gate line SGD. More specifically, the gates of the plurality of select transistors ST1 in the string unit SU0 are coupled in common to a select gate line SGD0. The gates of the plurality of select transistors ST1 in the string unit SU1 are coupled in common to a select gate line SGD1. The gates of the plurality of select transistors ST1 in the string unit SU2 are coupled in common to a select gate line SGD2. The gates of the plurality of select transistors ST1 in the string unit SU3 are coupled in common to a select gate line SGD3.

A plurality of select transistors ST2 in the same block BLK have their gates coupled in common to a select gate line SGS. A different select gate line SGS may be provided for each string unit SU, similarly to the select gate lines SGD.

The word lines WL0 to WL7, the select gate lines SGD0 to SGD3, and the select gate line SGS are each coupled to the row decoder 23.

Each bit line BL is coupled in common to one NAND string NS included in each string unit SU in each block BLK. The same column address is assigned to a plurality of NAND strings NS coupled to one bit line BL. Each bit line BL is coupled to the sense amplifier 24.

The source line SL is, for example, shared by a plurality of blocks BLK.

A set of a plurality of memory cell transistors MC coupled to a common word line WL in one string unit SU is referred to as, for example, a "cell unit CU". For example, write and read operations are executed on a cell unit CU basis.

1.1.3 Planar Configuration of Semiconductor Device

Next, an example of a planar configuration of the semiconductor device 1 will be described with reference to FIG. 3. FIG. 3 is a plan view of the semiconductor device 1. In the drawings to be referred to below, in the plan views, hatching is added as appropriate to facilitate visualization of the drawings. The hatching added to the plan views, however, may not necessarily relate to the materials or properties of the hatched structural elements.

As shown in FIG. 3, a planar layout of the semiconductor device 1 roughly includes an element region ER, a wall region WR, and a kerf region KR. Furthermore, the element region ER includes a core region CR and a peripheral circuit region PR. The wall region WR includes an inner peripheral region IR and an outer peripheral region OR.

The element region ER is a region in which elements that constitute the semiconductor device 1, such as the memory cell array 11, the sequencer 21, the voltage generator 22, the row decoder 23, and the sense amplifier 24, are provided.

The core region CR is, for example, a rectangular region provided in a central part of the element region ER. The memory cell array 11 is arranged in the core region CR. In addition, the core region CR may include the row decoder 23, the sense amplifier 24, etc. The core region CR may be in any shape and arranged in any region. If the semiconductor device 1 has a plurality of memory cell arrays 11, the semiconductor device 1 may have a plurality of core regions CR.

The peripheral circuit region PR is a square ring-shaped region, for example, that surrounds the outer periphery of the core region CR in the element region ER. In the peripheral circuit region PR, any circuit other than the memory cell array 11, contact plugs for coupling between the memory cell array 11 and other circuits, etc. are arranged. Alternatively, external connection terminals used for coupling the semiconductor device 1 to an external device, etc. are arranged in the peripheral circuit region PR.

The wall region WR is, for example, a square ring-shaped region provided so as to surround the outer periphery of the element region ER. When a crack or a peeling of an interlayer insulating film, etc., occurs at an end portion of the semiconductor device 1 in a dicing process, for example, the wall region WR suppresses the crack or the peeling from reaching the inside of the semiconductor device 1. The wall region WR also suppresses destruction of the elements in the semiconductor device 1 by releasing static electricity from the outside to the substrate. Furthermore, the wall region WR may be provided with a member to stabilize the electric potential of a power supply line, a well, etc. by fixing the outer periphery of the semiconductor device 1 at the same electric potential (ground potential VSS).

The inner peripheral region IR is, for example, a square ring-shaped region provided so as to surround the element region ER (peripheral circuit region PR) in the vicinity of the element region ER. The inner peripheral region IR is a region whose surface is protected (covered) by a surface protective layer in the wall region WR.

The outer peripheral region OR is, for example, a square ring-shaped region provided so as to surround the inner peripheral region IR. The outer peripheral region OR is a region whose surface is not protected (covered) by a surface protective layer in the wall region WR.

The kerf region KR is, for example, a square ring-shaped region provided so as to surround the outer peripheral region OR of the wall region WR, and includes a chip end portion. The kerf region KR is provided with, for example, alignment marks and patterns for characteristic checks used when manufacturing the semiconductor device 1. Structures in the kerf region KR may be removed by a dicing process.

1.1.4 Cross-Sectional Configuration of Semiconductor Device

Next, an example of a cross-sectional configuration of the semiconductor device 1 will be described with reference to FIG. 4. FIG. 4 shows a cross-sectional view of the semiconductor device 1. In the following description, an X direction is approximately parallel to the semiconductor substrate 201. For example, the X direction corresponds to a direction in which the word lines WL extend. A Y direction is approximately parallel to the semiconductor substrate 201 and intersects the X direction. For example, the Y direction corresponds to a direction in which the bit lines BL extend. A Z1 direction is approximately perpendicular to the semiconductor substrate 201 and corresponds to a direction from the array chip 10 toward the circuit chip 20. A Z2 direction is approximately perpendicular to the semiconductor substrate 201 and corresponds to a direction from the circuit chip 20 toward the array chip 10. The directions Z1 and Z2 will be referred to as the Z direction, unless otherwise specified.

As shown in FIG. 4, the semiconductor device 1 has a configuration in which the array chip 10 and the circuit chip 20 are bonded.

1.1.4.1 Internal Configuration of Array Chip

Subsequently, an internal configuration of the array chip 10 will be described with reference to FIG. 4.

The array chip 10 includes a semiconductor layer 101, insulating layers 102, 111, 112, 113, 114, 115, 117, 118, and 121, interconnect layers 103, 106, 116, and 108, conductors 104, 105, 107, 109, 120, and 130, electrode pads 110, a surface protective layer 119, and memory pillars MP.

1.1.4.1.1 Internal Configuration of Element Region

First, the element region ER, especially the core region CR included in the element region ER, of the array chip 10 will be described. The core region CR of the array chip 10 is provided with the memory cell array 11 and various interconnects for coupling the memory cell array 11 and the circuit chip 20.

The semiconductor layer 101 extends in the X direction and the Y direction. The semiconductor layer 101 provided in the core region CR functions as the source line SL. For example, the semiconductor layer 101 may contain silicon. In the core region CR, a plurality of insulating layers 102 and a plurality of interconnect layers 103 are alternately stacked one by one on the semiconductor layer 101 in the Z1 direction. In the example of FIG. 4, ten insulating layers 102 and ten interconnect layers 103 are alternately stacked one by one. In other words, the plurality of interconnect layers 103 with a space therebetween in the Z direction are provided between the semiconductor substrate 201 and the semiconductor layer 101. The interconnect layers 103 extend in the X direction. The interconnect layers 103 function as the word lines WL, and the select gate lines SGD and SGS. The insulating layers 102 may contain silicon oxide (SiO) as an insulating material. The interconnect layers 103 contain a conductive material. For example, the interconnect layers 103 may contain tungsten (W).

A plurality of memory pillars MP are provided in the core region CR. One memory pillar MP corresponds to one NAND string NS. For example, the memory pillar MP has a cylindrical shape extending in the Z direction. The memory pillar MP penetrates (passes through) the insulating layers 102 and the interconnect layers 103. An end portion (bottom surface) of each memory pillar MP in the Z2 direction reaches the semiconductor layer 101. The memory pillar MP includes a semiconductor layer. A part of the semiconductor layer in the memory pillar MP is in contact with the semiconductor layer 101. Details of the structure of the memory pillar MP will be described later.

The conductor 104 is provided on each of the memory pillars MP in the Z1 direction. For example, the conductor 104 has a cylindrical shape extending in the Z direction. The conductor 105 is provided on the conductor 104 in the Z1 direction. For example, the conductor 105 provided in the core region CR has a cylindrical shape extending in the Z direction. Furthermore, the interconnect layer 106 is provided on the conductor 105. For example, in the core region CR, a plurality of interconnect layers 106 are provided side by side in the X direction and are each extending in the Y direction. Each of the plurality of memory pillars MP is electrically coupled to any one of the plurality of interconnect layers 106 via the conductors 104 and 105. The interconnect layer 106 to which the memory pillar MP is coupled functions as a bit line BL. The conductors 104 and 105 and the interconnect layers 106 contain conductive materials. For example, the conductor 104 may contain W. For example, the conductors 105 and the interconnect layers 106 may contain copper (Cu).

The conductor 107 is provided on the interconnect layer 106 in the Z1 direction. For example, the conductor 107 provided in the core region CR has a cylindrical shape extending in the Z direction. The interconnect layer 108 is provided on the conductor 107. The conductor 109 is provided on the interconnect layer 108. For example, the conductor 109 provided in the core region CR has a cylindrical shape extending in the Z direction. The electrode pad 110 is provided on the conductor 109. The electrode pad 110 is electrically coupled to an electrode pad 211 of the circuit chip 20. Each of the plurality of interconnect layers 106 is electrically coupled to any one of the electrode pads 110 via the conductor 107, interconnect layer 108, and conductor 109. The conductors 107 and 109, interconnect layers 108, and electrode pads 110 contain conductive materials. For example, the conductors 107 and 109, interconnect layers 108, and electrode pads 110 may contain Cu. The number of interconnect layers provided between the interconnect layer 106 and the electrode pad 110 is freely selected.

In the bonding process between the array chip 10 and the circuit chip 20, the electrode pad 110 is coupled to the electrode pad 211. For example, if Cu is used for the electrode pad 110 and the electrode pad 211, Cu of the electrode pad 110 and Cu of the electrode pad 211 are bonded. Therefore, it is difficult to confirm the boundary between each Cu. However, due to a distortion of a bonding shape of the electrode pad 110 and electrode pad 211, or occurrence of a discontinuous portion between Cu barrier metal of the electrode pad 110 and Cu barrier metal of the electrode pad 211 on a side surface due to misalignment of the bonding, the location of bonding between the electrode pad 110 and the electrode pad 211 can be confirmed. When the electrode pads 110 and 211 are formed by the damascene method, their respective side surfaces have a tapered shape. Thus, a shape of a cross section along the Z direction at the portion where the electrode pad 110 and the electrode pad 211 are bonded together does not have a straight side wall, but a non-rectangular shape. Further, when the electrode pad 110 and the electrode pad 211 are bonded together, the barrier metal covers the bottom, side, and top surfaces of Cu that forms them. In contrast, in general Cu-based interconnect layers, an insulating layer (SiN or SiCN, etc.) with a function of preventing oxidation of Cu is provided on the top surface of Cu, and no barrier metal is provided. Therefore, even if no misalignment of the bonding occurs, it is possible to distinguish the electrode pads from the general interconnect layers.

The insulating layer 111 is provided so as to cover the insulating layers 102, interconnect layers 103, memory pillars MP, conductors 104, conductors 105, interconnect layers 106, conductors 107, interconnect layers 108, and conductors 109. The insulating layer 112 is provided on the insulating layer 111 in the Z1 direction. A plurality of electrode pads 110 are provided in the same layer as the insulating layer 112. The insulating layer 112 is in contact with an insulating layer 213 of the circuit chip 20.

The insulating layers 113 and 114 are stacked on the semiconductor layer 101 in the Z2 direction. Then, the insulating layer 115 is provided so as to cover the semiconductor layer 101 and the insulating layers 113 and 114. The insulating layers 113 and 115 may contain SiO as an insulating material. For the insulating layer 114, an insulating material with a function of preventing oxidation of metal (e.g., Cu) may be used. For example, the insulating layer 114 may contain SiCN or silicon nitride (SiN). The insulating layer 114 may be omitted.

The interconnect layer 116 is provided on the insulating layer 115 in the Z2 direction. The interconnect layer 116 provided in the core region CR is in contact with the semiconductor layer 101 in a region where the insulating layers 113 to 115 on the semiconductor layer 101 are removed. For example, the interconnect layer 116 in contact with the semiconductor layer 101 functions as a part of an interconnect layer that electrically couples the semiconductor layer 101 (source line SL) and the circuit chip 20. The interconnect layer 116 provided in the peripheral circuit region PR, for example, functions as a part of an interconnect layer used for coupling to an external device. For example, the interconnect layer 116 provided in the peripheral circuit region PR is electrically coupled to the electrode pad 110 via the conductor 130, conductor 105, interconnect layer 106, conductor 107, interconnect layer 108, and conductor 109 in a region where the semiconductor layer 101 and the insulating layers 113 to 115 are removed. The conductor 130 extends in the Z direction. One end of the conductor 130 in the Z2 direction is coupled to the interconnect layer 116, and the other end in the Z1 direction is coupled to the interconnect layer 106. The interconnect layer 116 is also provided in a region where the semiconductor layer 101 and the insulating layers 113 to 115 are removed in the wall region WR. However, the interconnect layer 116 in the wall region WR is not electrically coupled to the interconnect layer 116 provided in the element region ER (core region CR and peripheral circuit region PR). The interconnect layer 116 contains a conductive material. For example, the interconnect layer 116 may contain aluminum (Al).

The insulating layer 117 is provided on the interconnect layer 116 in the Z2 direction. The insulating layer 118 is provided on the insulating layer 117. Then, the surface protective layer 119 is provided on the insulating layer 118. The insulating layers 117 and 118 and the surface protective layer 119 are provided so as to cover the element region ER and the inner peripheral region IR of the wall region WR. That is, in the outer peripheral region OR of the wall region WR and the kerf region KR, the insulating layers 117 and 118 and the surface protective layer 119 are removed. Even in the peripheral circuit region PR, the insulating layers 117 and 118 and the surface protective layer 119 are removed in a region (hereinafter referred to as an "external connection terminal formation region") BR in which a connection terminal to an external device is provided. The insulating layer 117 may contain SiO as an insulating material. For example, an insulating material with low permeability is used for the insulating layer 118. For example, the insulting layer 118 may contain SiN. For example, the surface protective layer 119 may contain a resin material such as polyimide.

1.1.4.1.2 Internal Configuration of Wall Region

Next, a configuration of the wall region WR of the array chip 10 will be described. Wall units WU1 and WU2 and various interconnects for coupling the wall units WU1 and WU2 to the circuit chip 20 are provided in the wall region WR of the array chip 10. The wall units WU1 and WU2 are units that each include a plurality of conductors 120 provided so as to surround the element region ER (core region CR and peripheral circuit region. PR). An interface between the array chip 10 and the circuit chip 20 is located between the conductors 120 and the semiconductor substrate 201.

The wall unit WU1 is provided in the outer peripheral region OR of the wall region WR. The wall unit WU2 is provided in the inner peripheral region IR of the wall region WR. In other words, a surface of the wall unit WU1 is not covered by the surface protective layer 119. A surface of the wall unit WU2 is covered by the surface protective layer 119.

For example, when a crack, peeling of an insulating layer, etc. occurs at an end portion of the semiconductor device 1 in a dicing process, the wall unit WU1 functions as a crack stopper that inhibits the crack or peeling from reaching the element region ER. The wall unit WU1 also inhibits water, etc. from penetrating from the end portion of the semiconductor device 1 to the interior. For example, by providing the wall unit WU1 in the outer peripheral region OR (the region in which the surface protective layer 119, etc. are removed), cracks or moisture, etc. that have developed from the end portion of the semiconductor device 1 along the conductors 120 of the wall unit WU1 or the semiconductor layer 101 above it, are guided above (i.e., outside) the semiconductor device 1 in the outer peripheral region OR. In order to facilitate the guiding of cracks or moisture, etc. to the outside of the semiconductor device 1, the insulating layers 117 and 118 and the surface protective layer 119 are removed in the outer peripheral region OR.

For example, the wall unit WU2 releases static electricity from the outside to the semiconductor substrate 201 and suppresses destruction of the elements caused by surges.

The semiconductor layer 101 of the wall region WR is provided in the same layer as the semiconductor layer 101 of the element region ER (core region CR). The semiconductor layer 101 of the wall region WR does not function as a source line SL. The insulating layer 121 is provided inside the semiconductor layer 101 of the wall region WR. For example, the semiconductor layers 101 are provided near the peripheral circuit region PR and between the wall units WU1 and WU2 in the wall region WR. Hereafter, when specifying the semiconductor layer 101 in the region between the wall unit WU1 and the wall unit WU2, i.e., near the boundary between the inner peripheral region IR and the outer peripheral region OR, it is denoted as the semiconductor layer 101_1. The semiconductor layer 101_1 is not electrically coupled to any circuit in the element region ER. At least a portion of the semiconductor layer 101_1 is not covered (protected) by the surface protective layer 119. That is, at least a portion of the semiconductor layer 101_1 is not provided between the semiconductor substrate 201 and the surface protective layer 119 in the Z direction. In other words, at least a portion of the semiconductor layer 101_1 is arranged in the outer peripheral region OR. Further, a portion of the semiconductor layer 101_1 is provided at a position overlapping the wall unit WU1 in the Z direction.

The entire semiconductor layer 101_1 may be arranged in the outer peripheral region OR.

For example, a plurality of protruding portions PT extending in the Z2 direction are provided on a surface of the semiconductor layer 101_1 facing the Z2 direction. The protruding portions PT penetrate the insulating layer 113. For example, an upper surface of the protruding portions PT is in contact with the insulating layer 114. For example, the semiconductor layer 101_1 has a square ring shape surrounding the element region ER on an XY plane. In this case, the protruding portions PT may each have a square ring shape surrounding the element region ER on the XY plane. The protruding portions PT are used to ground the semiconductor layer 101 to the substrate of the array chip 10 during the manufacturing process of the array chip 10, for example, to suppress an occurrence of arcing due to charging-up of the semiconductor layer 101 during dry etching. The protruding portions PT may not be provided.

Each conductor 120 has, for example, a square ring shape on the XY plane. Each conductor 120 extends in the Z direction. In the example of FIG. 4, the wall unit WU1 includes, for example, three conductors 120. Further, the wall unit WU2 includes, for example, four conductors 120. Hereinafter, when distinguishing each of the conductors 120, they will be denoted as conductors 120_1 to 120_7, in order from the kerf region KR side. That is, the wall unit WU1 includes the conductors 120_1 to 120_3. The wall unit WU2 includes the conductors 120_4 to 120_7.

The conductor 120_2 is provided between the element region ER and the conductor 120_1. The conductor 120_3 is provided between the element region ER and the conductor 120_2. The conductor 120_4 is provided between the element region ER and the conductor 120_3. The conductor 120_5 is provided between the element region ER and the conductor 120_4. The conductor 120_6 is provided between the element region ER and the conductor 120_5. In other words, the conductors 120_5 and 120_6 are provided between the element region ER and the semiconductor layer 101_1. The conductor 120_7 is provided between the element region ER and the conductor 120_6. The conductors 120_1 to 120_3 are provided in the outer peripheral region OR of the wall region WR. The conductor 120_3 may be in the inner peripheral region IR of the wall region WR. The conductors 120_4 to 120_7 are provided in the inner peripheral region IR of the wall region WR. In other words, the conductors 120_4 to 120_7 are provided at a position overlapping the surface protective layer 119 in the Z direction.

For example, one end of each of the conductors 120_1 and 120_2 in the Z2 direction is in contact with the insulating layer 115. One end of the conductor 120_3 in the Z2 direction is in contact with the semiconductor layer 101_1 provided between the wall unit WU1 and the wall unit WU2. In the example of FIG. 4, the conductors 120_1 to 120_3 are coupled in common to one interconnect layer 108 via different conductors 105, interconnect layers 106, and conductors 107. Hereinafter, when specifying the interconnect layer 108 electrically coupled to the conductors 120_1 to 120_3, it is denoted as an interconnect layer 108_1. The conductor 105, interconnect layer 106, and conductor 107, which are electrically coupled to the conductor 120, may each have a square ring shape on the XY plane. The shape of the interconnect layer 108_1 on the XY plane will be described later. The interconnect layer 108_1 is coupled to the electrode pad 110 via the conductor 109. The conductor 109 and the electrode pad 110, which are electrically coupled to the conductor 120, may have a square ring shape on the XY plane.

The number of conductors 120 included in the wall unit WU1 is not limited to three. It suffices that there are two or more conductors 120 included in the wall unit WU1. For example, the conductor 120_1 is provided so as to enhance the processing accuracy of a groove when forming a groove to be filled with the conductor 120_2. Thus, the conductor 120_1 may be omitted. A plurality of conductors 120 for the same purpose as the conductor 120_1 may be provided. Then, it suffices that at least one conductor 120 is coupled to the semiconductor layer 101. Furthermore, it suffices that at least one of the conductors 120_2 and 120_3 may have a ring shape that continuously surrounds the outer periphery of the element region ER on the XY plane, while the other of the conductors 120_2 and 120_3 may be formed in a pattern that intermittently surrounds the outer periphery of the element region ER. In this case, the same applies to the patterns of the conductor 105, interconnect layer 106, and conductor 107 that are electrically coupled to the other of the conductors 120_2 and 120_3. In this example, the case in which the conductors 120_1 to 120_3 are coupled in common to the interconnect layer 108_1 has been described, but is not limited thereto. The conductors 120_1 to 120_3 may be coupled in common to one interconnect layer 106 via different conductors 105. Further, the conductors 120_1 to 120_3 may be coupled in common to one electrode pad 110 via different conductors 105, interconnect layers 106, conductors 107, interconnect layers 108, and conductors 109. Furthermore, the conductors 120_1 to 120_3 may be coupled in common to any one of the interconnect layers of the circuit chip 20 without being coupled in common within the array chip 10. Furthermore, the conductors 120_1 to 1203 may be electrically coupled to the semiconductor substrate 201 via separate current paths.

For example, one end of the conductors 120_4 and 120_7 in the Z2 direction contacts the insulating layer 115. For example, one end of the conductors 120_5 and 120_6 in the Z2 direction contacts the interconnect layer 116 provided in the inner peripheral region IR of the wall region WR. No external connection terminal formation region BR is provided on the interconnect layer 116 provided in the inner peripheral region IR. The interconnect layer 116 is covered by the surface protective layer 119. One end of the conductors 120_4 and 120_7 in the Z2 direction may be in contact with the semiconductor layer 101 or the interconnect layer 116, or inside the insulating layer 111.

The conductors 120_4 and 120_7 are not coupled to the conductor 105. The conductors 120_5 and 120_6 are coupled to different conductors 105, interconnect layers 106, conductors 107, interconnect layers 108, conductors 109, and electrode pads 110, respectively. Hereinafter, when specifying the interconnect layer 108 electrically coupled to the conductor 120_5, it is denoted as an interconnect layer 1082. When specifying the interconnect layer 108 electrically coupled to the conductor 120_6, it is denoted as an interconnect layer 108_3. The interconnect layers 108_2 and 108_3 may have a square ring shape on the XY plane.

The number of conductors 120 included in the wall unit WU2 is not limited to four. It suffices that there are two or more conductors 120 included in the wall unit WU2. For example, the conductors 120_4 and 120_7 are provided to enhance the processing accuracy of grooves when forming grooves to be filled with the conductors 120_5 and 120_6. Thus, the conductors 120_4 and 120_7 may be omitted. Further, a plurality of conductors 120 for the same purpose as each of the conductors 120_4 and 120_7 may be provided. Then, it suffices that at least two conductors 120 are electrically coupled to an N-type impurity diffusion region NW and a P-type impurity diffusion region PW provided in the semiconductor substrate 201, respectively.

1.1.4.2 Internal Configuration of Circuit Chip

Next, an internal configuration of the circuit chip 20 will be described.

The element region ER (core region CR and peripheral circuit region PR) of the circuit chip 20 is provided with the sequencer 21, voltage generator 22, row decoder 23, sense amplifier 24, and various interconnects for coupling these circuits. The wall region WR of the circuit chip 20 is provided with various interconnects for electrically coupling the conductors 120 and the semiconductor substrate 201.

The circuit chip 20 includes the semiconductor substrate 201, the N-type impurity diffusion region NW, the P-type impurity diffusion region PW, a transistor TR, a gate insulating film 202, a gate electrode 203, conductors 204, 206, 208, and 210, interconnect layers 205, 207, and 209, an electrode pad 211, and insulating layers 212 and 213.

In the core region CR and the peripheral circuit region PR, a plurality of transistors TR are provided on the semiconductor substrate 201.

The transistors TR are used for the sequencer 21, the voltage generator 22, the row decoder 23, the sense amplifier 24, etc. The transistors TR each include the source and drain (not shown) formed on the semiconductor substrate 201, the gate insulating film 202, and the gate electrode 203. The gate insulating film 202 is provided on the semiconductor substrate 201. The gate electrode 203 is provided on the gate insulating film 202.

In the element region ER, the conductors 204 are provided on the gate electrode 203, source, and drain. In the wall region WR, the conductors 204 are provided on the semiconductor substrate 201, the N-type impurity diffusion region NW provided in the semiconductor substrate 201, and the P-type impurity diffusion region PW provided in the semiconductor substrate 201. For example, the conductor 204 provided in the element region ER has a cylindrical shape extending in the Z direction.

The interconnect layer 205 is provided on the conductor 204. The conductor 206 is provided on the interconnect layer 205. The interconnect layer 207 is provided on the conductor 206. The conductor 208 is provided on the interconnect layer 207. The interconnect layer 209 is provided on the conductor 208. The conductor 210 is provided on the interconnect layer 209. For example, the conductors 204, 206, 208, and 210 provided in the element region ER each have a cylindrical shape extending in the Z direction. The electrode pad 211 is provided on the conductor 210. The number of interconnect layers provided in the circuit chip 20 is freely selected.

The insulating layer 212 is provided on the semiconductor substrate 201. The insulating layer 212 is provided so as to cover the transistors TR, conductors 204, interconnect layers 205, conductors 206, interconnect layers 207, conductors 208, interconnect layers 209, and conductors 210. The insulating layer 213 is provided on the insulating layer 212. A plurality of electrode pads 211 are provided in the same layer as the insulating layer 213.

The gate electrodes 203, conductors 204, 206, 208, and 210, interconnect layers 205, 207, and 209, and electrode pads 211 are composed of conductive materials, and may contain metallic materials, p-type or n-type semiconductors, etc. For example, the electrode pads 211 may contain Cu.

The gate insulating film 202, insulating layer 212, and insulating layer 213 may contain SiO as an insulating material.

In the example of FIG. 4, the conductors 120_1 to 120_3 of the wall region WR are electrically coupled to the semiconductor substrate 201 via the electrode pad 211, conductor 210, interconnect layer 209, conductor 208, interconnect layer 207, conductor 206, interconnect layer 205, and conductor 204. In other words, the conductors 120_1 to 120_3 are grounded to the semiconductor substrate 201. Similarly, the conductor 120_5 is electrically coupled to the N-type impurity diffusion region NW of the semiconductor substrate 201. The conductor 120_6 is electrically coupled to the P-type impurity diffusion region PW of the semiconductor substrate 201. The conductors 204, 206, 208, and 210, interconnect layers 205, 207, and 209, and electrode pads 211 corresponding to the conductors 120 may each have a square ring shape on the XY plane. The conductor 120_5 may be electrically coupled to the P-type impurity diffusion region PW, and the conductor 120_6 may be electrically coupled to the N-type impurity diffusion region NW.

1.1.4.3 Configuration of Memory Pillar

Next, an example of a configuration of the memory pillar MP will be described with reference to FIG. 5. FIG. 5 is a cross-sectional view of the memory cell array 11.

As shown in FIG. 5, for example, the semiconductor layer 101 includes three semiconductor layers 101a, 101b, and 101c. The semiconductor layer 101b is provided on the semiconductor layer 101a in the Z1 direction. The semiconductor layer 101c is provided on the semiconductor layer 101b. For example, the semiconductor layer 101b is formed by replacing the insulating layer 121 provided between semiconductor layer 101a and the semiconductor layer 101c. The semiconductor layers 101a to 101c may contain silicon. Further, the semiconductor layers 101a to 101c may contain phosphorus (P) as a semiconductor impurity.

On the semiconductor layer 101 in the Z1 direction, ten insulating layers 102 and ten interconnect layers 103 are alternately stacked one by one. In the example of FIG. 5, the ten interconnect layers 103 function as a select gate line SGS, word lines WL0 to WL7, and a select gate line SGD in order from the side closer to the semiconductor layer 101. A plurality of interconnect layers 103 that function as the select gate lines SGS and SGD may be provided. For example, a stacked structure of titanium nitride (TiN)/tungsten (W) may be used as a conductive material of the interconnect layers 103. In this case, TiN is formed so as to cover W. TiN has a function as a barrier layer for suppressing oxidation of W or as an adhesion layer for enhancing adhesion of W when forming W by, for example, chemical vapor deposition (CVD). The interconnect layers 103 may contain a high dielectric constant material such as AlO. In this case, the high dielectric constant material is formed so as to cover the conductive material. For example, in each of the interconnect layers 103, the high dielectric constant material is provided so as to be in contact with the insulating layers 102 provided above and below each interconnect layer 103 and the side surface of the memory pillar MP. Then, TiN is provided so as to be in contact with the high dielectric constant material. W is then provided so as to be in contact with TiN and fill the inside of each interconnect layer 103.

The insulating layer 111 is provided on the interconnect layer 103 that functions as the select gate line SGD.

The plurality of memory pillars MP are provided in the memory cell array 11. The memory pillars MP each have an approximately cylindrical shape extending in the Z direction. The memory pillars MP each penetrate the ten interconnect layers 103. The bottom surface of each memory pillar MP reaches the semiconductor layer 101. The memory pillars MP may each have a structure in which a plurality of pillars are connected in the Z direction.

An internal configuration of the memory pillar MP will be described. The memory pillar MP includes a block insulating film 140, a charge storage layer 141, a tunnel insulating film 142, a semiconductor layer 143, a core layer 144, and a cap layer 145.

The block insulating film 140, the charge storage layer 141, and the tunnel insulating film 142 are stacked in this order from the outer side on a part of the side surface and the bottom surface in the Z2 direction of the memory pillar MP. Specifically, in the same layer as the semiconductor layer 101b and the vicinity thereof, the block insulating film 140, the charge storage layer 141, and the tunnel insulating film 142 on the side surface of the memory pillar MP are removed. The semiconductor layer 143 is provided so as to be in contact with the side surface and the bottom surface of the tunnel insulating film 142 and the semiconductor layer 101b. The semiconductor layer 143 is a region in which channels of the memory cell transistors MC and the select transistors ST1 and ST2 are to be formed. The inside of the semiconductor layer 143 is filled with the core layer 144. The capping layer 145 is provided on the semiconductor layer 143 and the core layer 144 in an upper portion of the memory pillar MP. The side surface of the capping layer 145 contacts the tunnel insulating film 142.

The memory pillar MP in combination with the interconnect layers 103 respectively functioning as the word lines WL0 to WL7 forms the memory cell transistors MC0 to MC7. Similarly, the memory pillar MP in combination with the interconnect layer 103 functioning as the select gate line SGD forms the select transistor ST1. The memory pillar MP in combination with the interconnect layer 103 functioning as the select gate line SGS forms the select transistor ST2.

The block insulating film 140, the tunnel insulating film 142, and the core layer 144 may contain SiO as an insulating material. The charge storage layer 141 may contain SiN. The semiconductor layer 143 and the capping layer 145 may contain silicon.

The conductor 104 is provided on the capping layer 145. The conductor 105 is provided on the conductor 104. The conductor 105 is coupled to the interconnect layer 106.

1.1.5 Configurations of Wall Units WU1 and WU2

Figure 8:
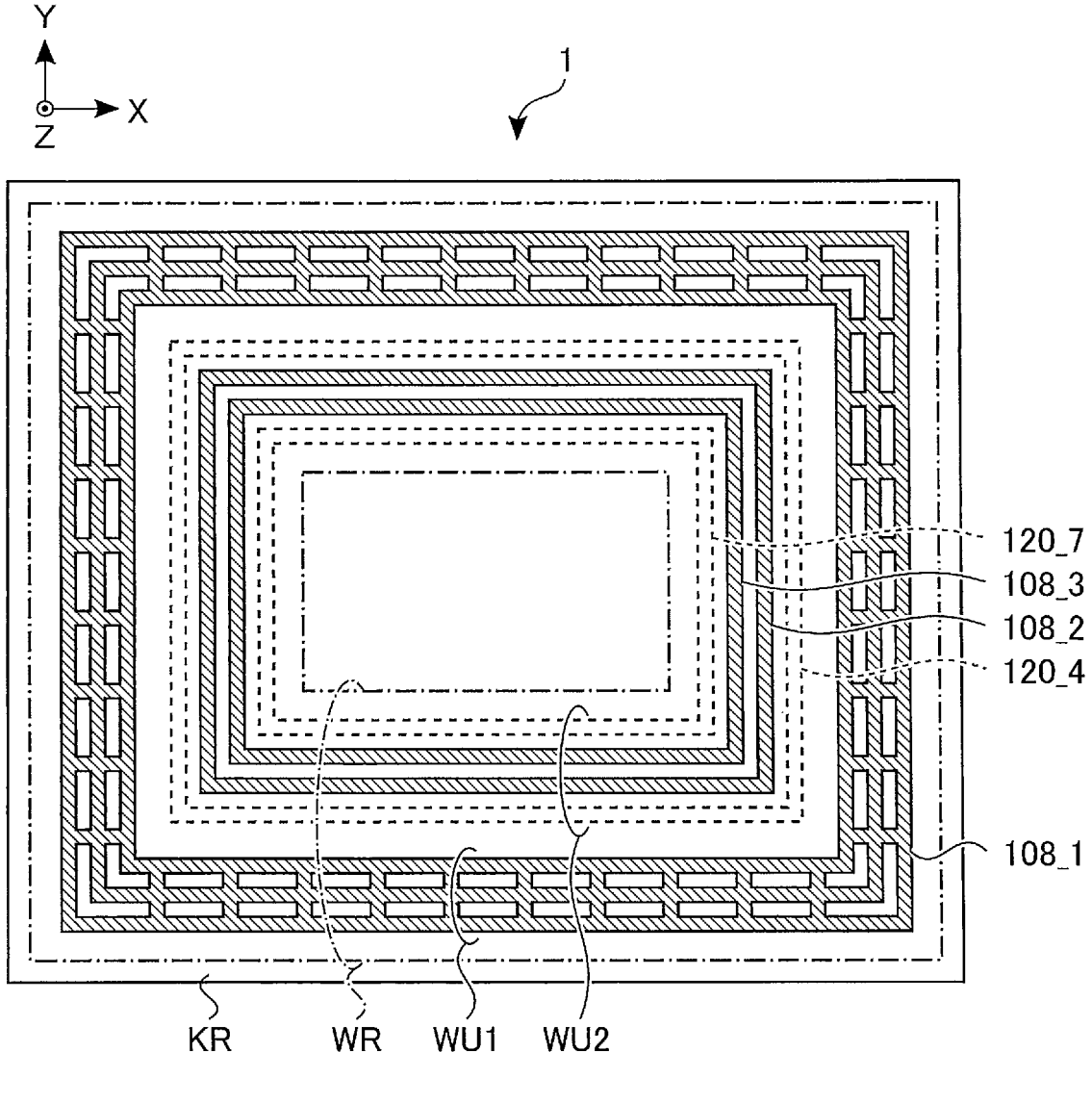
FIG. 8 is a plan view of interconnect layers 108 along line B1-B2 of FIG. 6.

Next, with reference to FIGS. 6 to 8, an example of configurations of the wall units WU1 and WU2 will be described. FIG. 6 is a cross-sectional view of the wall units WU1 and WU2. FIG. 7 is a plan view of the conductors 120 taken along line A1-A2 of FIG. 6. FIG. 8 is a plan view of the interconnect layers 108 taken along line B1-B2 of FIG. 6. In the example of FIG. 7, elements other than the conductors 120 are omitted. In the example of FIG. 8, elements other than the interconnect layers 108 of the wall region WR are omitted. In the descriptions of FIGS. 6 to 8, points overlapping the description of FIG. 4 will be omitted.

As shown in FIG. 6, the conductor 120 has a tapered shape toward the Z2 direction. That is, an area of a surface of the conductor 120 facing the Z1 direction is larger than an area of the conductor 120 facing the Z2 direction. The semiconductor layer 101_1 includes the semiconductor layers 101a and 101c, and does not include the semiconductor layer 101b. In a region provided with the protruding portions PT of the semiconductor layer 101_1, the semiconductor layer 101a and the semiconductor layer 101c directly contact each other without the semiconductor layer 101b interposed therebetween. The protruding portions PT are protruding portions of the semiconductor layer 101a. For example, the insulating layer 121 includes three insulating layers 121a, 121b, and 121c. In the semiconductor layer 101 other than that in the core region CR, the process of replacing the insulating layer 121 (121a to 121c) with the semiconductor layer 101b is not performed. Thus, the insulating layers 121a to 121c remain inside the semiconductor layer 101_1. For example, the insulating layers 121a and 121c may contain SiO as an insulating material. The insulating layer 121b may contain SiN as an insulating material.

Next, a planar layout of the conductor 120 will be described.

As shown in FIG. 7, for example, the conductors 120_1 to 120_7 each have a square ring shape on the XY plane. The conductors 120_1 to 120_7 are not in contact with each other. The conductors 120_1 to 120_3 may be in contact with each other. Further, the conductors 120_1 to 120_7 may not be square as long as they are ring-shaped.

Next, a planar layout of the interconnect layer 108 will be described.

As shown in FIG. 8, for example, the interconnect layer 108_1 has a pattern in which a grid-like interconnect layer is arranged in a square ring shape. The interconnect layer 108_1 is electrically coupled to the conductors 120_1 to 120_3. More specifically, for example, in the interconnect layer 108_1, three-row ring-shaped interconnect layers are provided at a position facing the conductors 120_1 to 120_3 in the Z direction. Then, the grid-like interconnect layer is formed in such a manner that the three-row interconnect layers are coupled to each other. The shape of the interconnect layer 108_1 is not limited thereto. It suffices that the interconnect layer 108_1 has a structure to which the conductors 120_1 to 120_3 can be electrically coupled. For example, the interconnect layer 108_1 may be a line-shaped (one-row) interconnect layer having a width from the conductor 120_1 to the conductor 120_3.

The interconnect layers 108_2 and 108_3 have, for example, a line shape arranged in a square ring shape. The interconnect layer 1082 is electrically coupled to the conductor 120_5. The interconnect layer 108_3 is electrically coupled to the conductor 120_6. More specifically, for example, the interconnect layer 108_2 is provided at a position facing the conductor 120_5 in the Z direction. The interconnect layer 108_3 is provided at a position facing the conductor 120_6 in the Z direction. The interconnect layer 108 is not provided at positions facing the conductors 120_4 and 120_7 in the Z direction.

1.2 Manufacturing Process of Semiconductor Device after Chip Bonding

Next, a manufacturing process of the semiconductor device after bonding the array chip 10 and the circuit chip 20 will be described with reference to FIGS. 9 to 16. FIGS. 9 to 16 are cross-sectional views of the element region ER and the wall region WR showing the manufacturing process of the semiconductor device.

As shown in FIG. 9, the substrate of the array chip 10 is removed after bonding the array chip 10 and the circuit chip 20. After that, the insulating layer 114 is formed on the insulating layer 113 in the Z2 direction. An insulating layer containing SiO, for example, may be further formed on the insulating layer 114.

As shown in FIG. 10, the semiconductor layer 101 and the insulating layers 121, 113, and 114 are processed.

Figure 11:
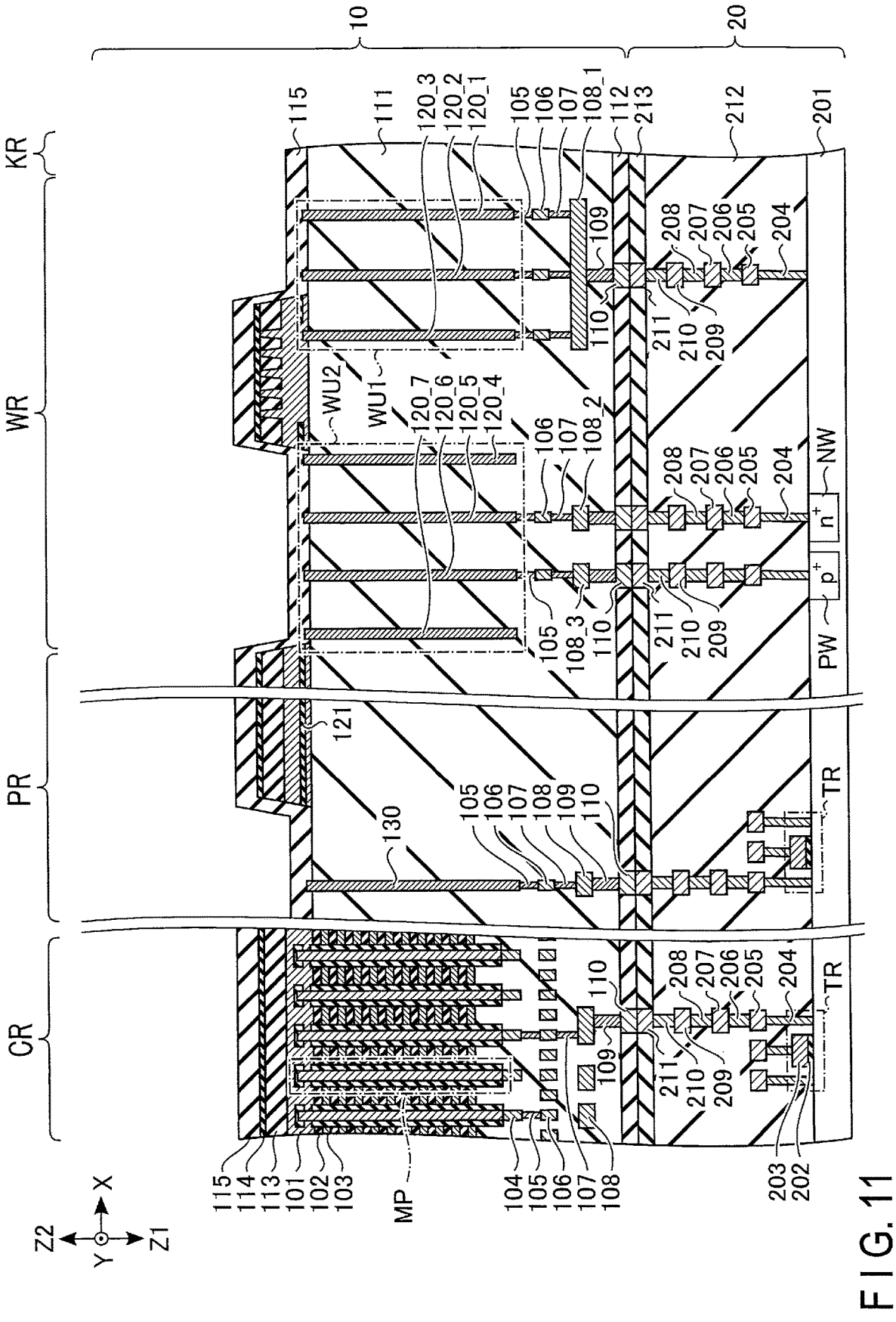
FIG. 11 is a cross-sectional view showing a manufacturing process of the semiconductor device according to the first embodiment.

As shown in FIG. 11, the insulating layer 115 is formed so as to cover the entire top surface in the Z2 direction.

As shown in FIG. 12, the insulating layers 113, 114, and 115 are processed. This exposes, for example, a part of the semiconductor layer 101 in the core region CR. In the peripheral circuit region PR, an end portion of the conductor 130 in the Z2 direction is exposed. In the wall region WR, end portions of the conductors 120_5 and 120_6 in the Z2 direction are exposed.

As shown in FIG. 13, the interconnect layer 116 is formed. For example, in the core region CR, the interconnect layer 116 is coupled to the semiconductor layer 101. In the peripheral circuit region PR, the interconnect layer 116 is coupled to the conductor 130. In the wall region WR, the interconnect layer 116 is coupled to the conductors 120_5 and 120_6.

Figure 14:
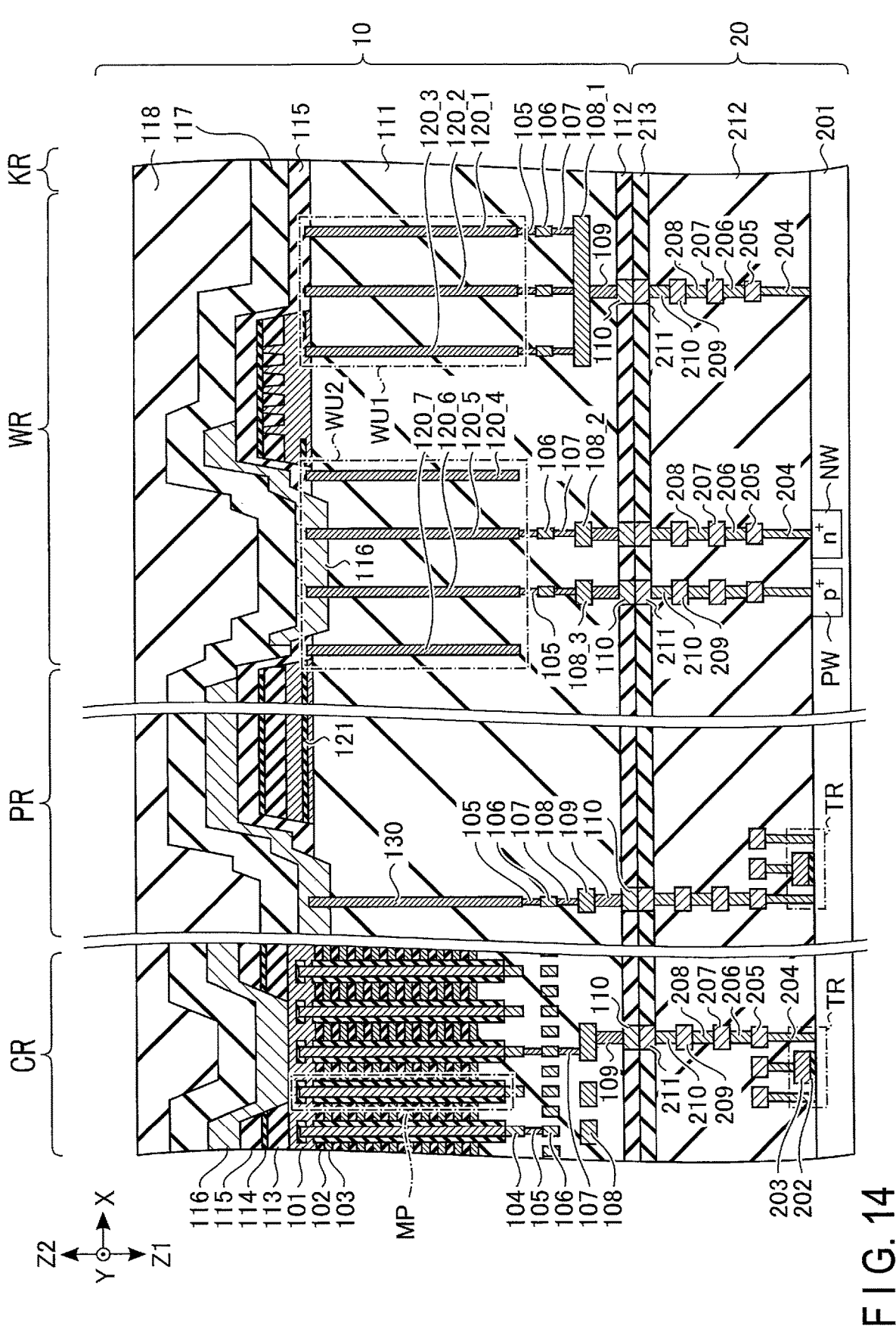
FIG. 14 is a cross-sectional view showing a manufacturing process of the semiconductor device according to the first embodiment.

As shown in FIG. 14, the insulating layers 117 and 118 are formed so as to cover the entire top surface in the Z2 direction.

Figure 15:
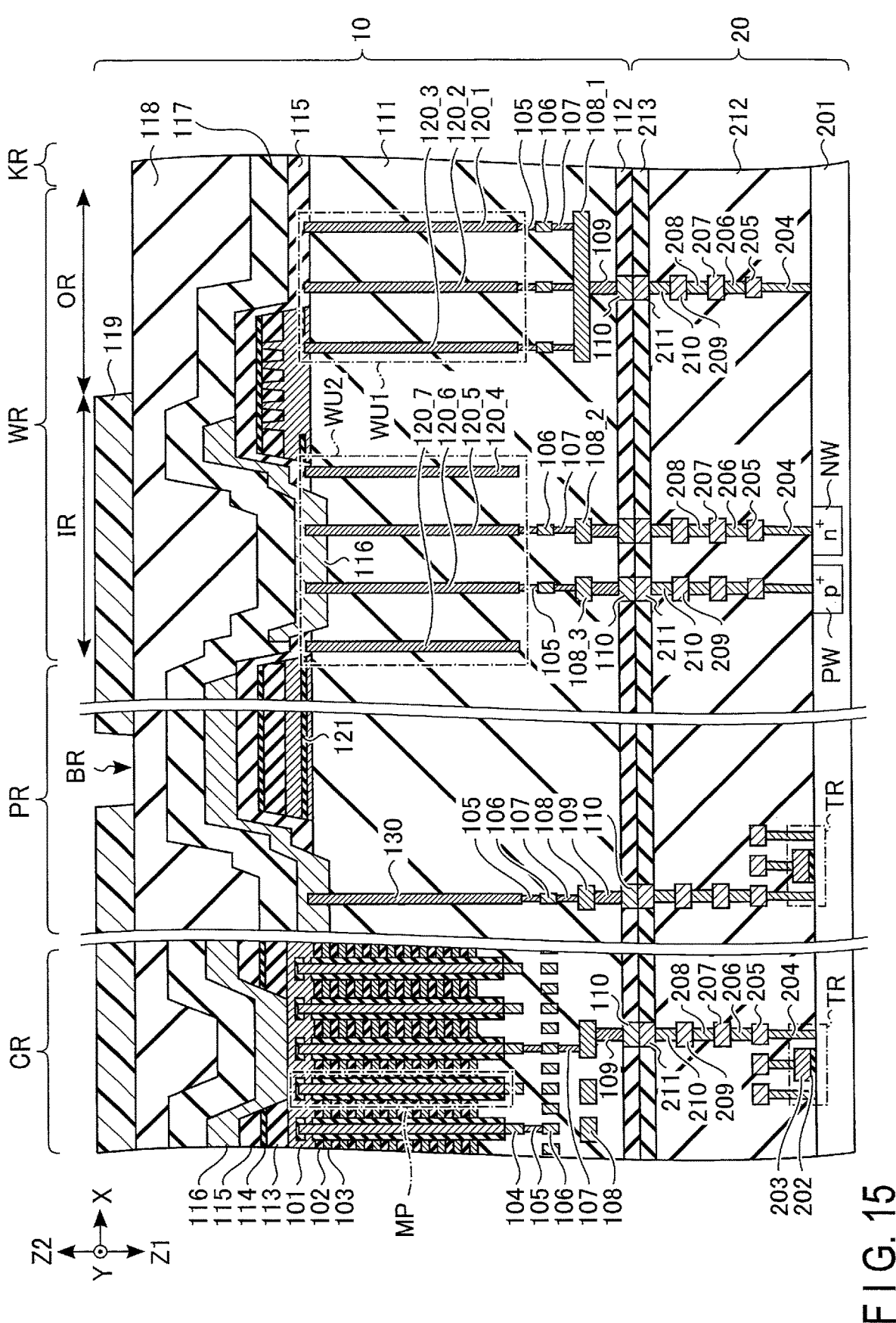
FIG. 15 is a cross-sectional view showing a manufacturing process of the semiconductor device according to the first embodiment.

As shown in FIG. 15, the surface protective layer 119 is formed. After that, the insulating layers 117 and 118 are processed with the surface protective layer 119 as a mask. As a result, in the peripheral circuit region PR, the interconnect layer 116 is exposed in the external connection terminal formation region BR. As shown in FIG. 4, in the outer peripheral portion of the wall region WR and the kerf region KR, the insulating layers 117 and 118 not covered by the surface protective layer 119 are processed so that the insulating layer 115 is exposed. As shown in FIG. 16, when processing the insulating layers 117 and 118, there is a case in which the insulating layers 114 and 115 not covered by the surface protective layer 119 may also be removed in the outer peripheral portion of the wall region WR and the kerf region KR. In this case, the semiconductor layer 101 and the conductors 120_1 and 120_2 not covered by the surface protective layer 119 are exposed.

1.3 Advantageous Effect according to Present Embodiment

The configuration according to the present embodiment can improve the yield of the semiconductor device 1. This advantageous effect will be described in detail.

As described with reference to FIG. 16, for example, in the manufacturing process of the semiconductor device 1, when processing the insulating layers 117 and 118, there is a case in which the semiconductor layer 101_1 and the conductors 120_1 and 120_2 not covered by the surface protective layer 119 may be exposed. When the semiconductor layer 101_1 (and the conductor 120_3 coupled to the semiconductor layer 101_1) and the conductors 120_1 and 120_2 are in a floating state (a state of not being grounded to the semiconductor substrate 201), arcing may occur due to charging-up by dry etching of the insulating layers 117 and 118.

In contrast, with the configuration according to the present embodiment, the plurality of conductors 120 (120_1 to 120_3) constituting the wall unit WU1 are coupled (grounded) to the semiconductor substrate 201 via the interconnect layer 108_1 to which the conductors 120 are coupled in common. Thus, when processing the insulating layers 117 and 118, it is possible to release electric charges generated at the semiconductor layer 101 and the conductors 120 exposed in the wall region WR to the semiconductor substrate 201. Thereby, the occurrence of arcing can be suppressed. Therefore, the yield of the semiconductor device 1 can be improved.

2. Second Embodiment

Next, a second embodiment will be described. In the second embodiment, two example configurations of the wall region WR that are different from that in the first embodiment will be described. Hereinafter, points different from the first embodiment will be mainly described.

2.1 First Example

Figure 17:
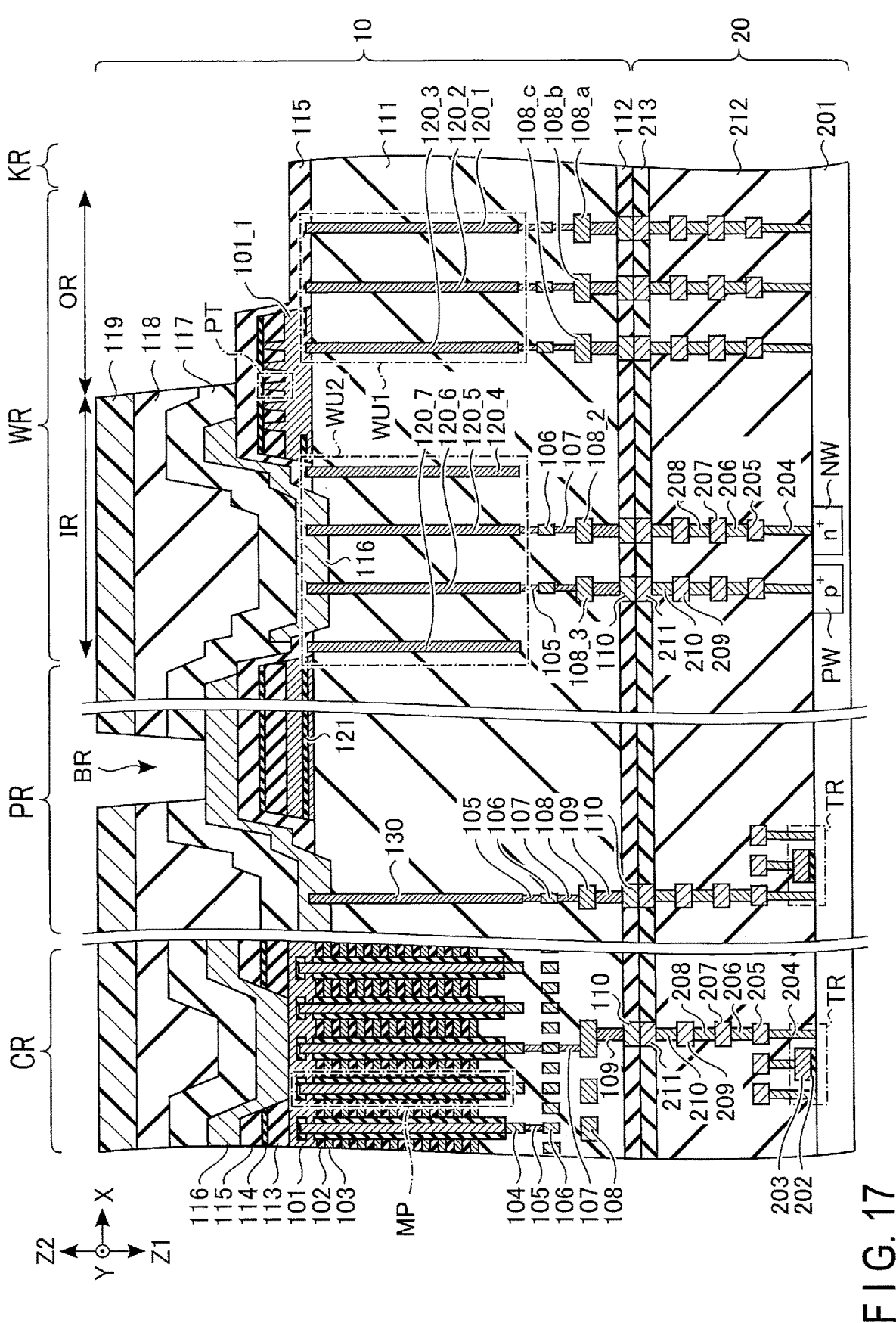
FIG. 17 is a cross-sectional view of a semiconductor device according to a first example of a second embodiment.
Figure 18:
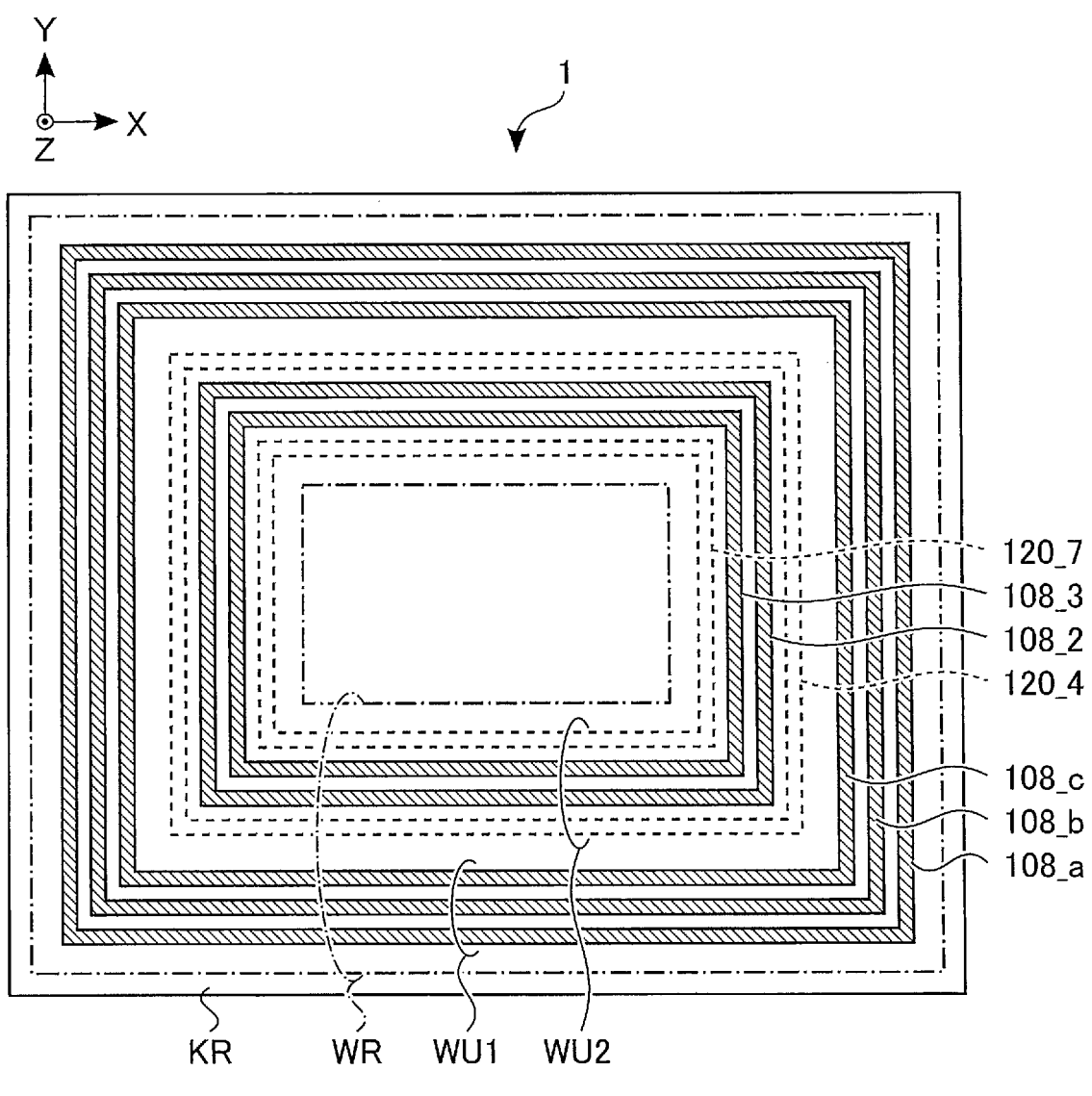
FIG. 18 is a plan view of interconnect layers 108 in the semiconductor device according to the first example of the second embodiment.

A configuration of the wall region WR in a first example will be described with reference to FIGS. 17 and 18. FIG. 17 shows a cross section of the semiconductor device 1. FIG. 18 is a plan view of the interconnect layer 108.

As shown in FIG. 17, in this example, the conductors 120_1 to 120_3 of the wall unit WU1 are electrically coupled to the semiconductor substrate 201 via separate current paths. More specifically, for example, the conductors 120_1 to 120_3 are respectively coupled to the semiconductor substrate 201 via different conductors 105, interconnect layers 106, conductors 107, interconnect layers 108, conductors 109, electrode pads 110 and 211, conductors 210, interconnect layers 209, conductors 208, interconnect layers 207, conductors 206, interconnect layers 205, and conductors 204. In the following descriptions, when specifying each of the interconnect layers 108 coupled to the conductors 120_1, 120_2, and 120_3, they are referred to as interconnect layers 108_a, 108_b, and 108c, respectively.

As shown in FIG. 18, for example, the interconnect layers 108_a to 108_c each have a line shape arranged in a square ring shape. For example, the interconnect layers 108_a to 108_c are provided at positions facing the conductors 120_1 to 1203, respectively, in the Z direction.

2.2 Second Example

A configuration of the wall region WR of a second example will be described with reference to FIG. 19. FIG. 19 shows a cross section of the semiconductor device 1.

As shown in FIG. 19, in this example, the conductors 120_1 to 120_3 are coupled in common to the interconnect layer 209 provided in the circuit chip 20. In this case, for example, the interconnect layer 209 may have a pattern similar to that of the interconnect layer 108_1 described in FIG. 8 of the first embodiment.

2.3 Advantageous Effect of Present Embodiment

The configuration of the present embodiment achieves an advantageous effect similar to that of the first embodiment.

3. Modification, Etc.

According to the above embodiments, the semiconductor device includes: a substrate (201) including an element region (ER) and a first region (WR) surrounding the element region; a surface protective layer (119) provided in the element region and a part of the first region; a first semiconductor layer (101_1) at least a part of which is arranged in a second region (OR), the second region being included in the first region and not provided with the surface protective layer; and a first conductor (120_3) provided in the first region, surrounding the element region, arranged between the substrate and the first semiconductor layer in a first direction (Z direction), and including one end in contact with the first semiconductor layer. The first conductor is electrically coupled to the substrate.

The manufacturing yield of the semiconductor device 1 can be improved by applying the above embodiments.

The embodiments are not limited to the above-described aspect, and can be modified in various ways.

For example, in the above embodiments, the case in which the conductor 120_3 has a ring shape surrounding the element region ER and the wall unit WU2 has been described, but the shape of the conductor 120_3 is not limited thereto. If the conductors 120_1 and 120_2 are ring-shaped, the wall unit WU1 may have a function as a crack stopper. In this case, the conductor 120_3 may not be ring-shaped as long as the semiconductor layer 101_1 and the semiconductor substrate 201 are electrically coupled via the conductor 120_3. For example, the conductor 120_3 may be a part of the square ring shape shown in FIG. 7 or may be a set of a plurality of divided portions of the square ring shape.

Furthermore, the term "couple" in the above-described embodiments also includes the state of indirect coupling with other components, such as a transistor and a resistor, interposed therebetween.

The embodiments are mere examples, and the scope of the invention is not limited thereto.

The invention claimed is:

1. A semiconductor device comprising:
   a substrate including an element region and a first region surrounding the element region;
   a surface protective layer provided in the element region and a part of the first region;
   a first semiconductor layer at least a part of which is arranged in a second region, the second region being included in the first region and not provided with the surface protective layer;
   a first conductor provided in the first region, surrounding the element region, arranged between the substrate and the first semiconductor layer in a first direction, and including one end in contact with the first semiconductor layer; and
   a second conductor provided in a layer in which the first conductor is provided in the first region, surrounding the first conductor and the first semiconductor layer, and not in contact with the first semiconductor layer,
   wherein
   the first conductor and the second conductor are electrically coupled to the substrate and are provided in the second region.

2. The semiconductor device according to claim 1, further comprising:
   a second semiconductor layer provided in a layer in which the first semiconductor layer is provided in the element region;
   a first interconnect layer provided between the substrate and the second semiconductor layer in the first direction; and
   a memory pillar extending in the first direction, passing through the first interconnect layer, and including a third semiconductor layer in contact with the second semiconductor layer.

3. The semiconductor device according to claim 1, further comprising:
   a second interconnect layer provided between the substrate and the first and second conductors in the first direction and to which the first conductor and the second conductor are electrically coupled,
   wherein the first conductor and the second conductor are electrically coupled to the substrate via the second interconnect layer.

4. The semiconductor device according to claim 3, wherein
   the second interconnect layer surrounds the element region and is formed in a grid-like pattern.

5. The semiconductor device according to claim 1, wherein
the first semiconductor layer surrounds the element region.

6. The semiconductor device according to claim 1, wherein
the first semiconductor layer includes a protruding portion that protrudes toward a side opposite to a side on which the first conductor is arranged in the first direction.

7. The semiconductor device according to claim 6, wherein
the protruding portion surrounds the element region.

8. The semiconductor device according to claim 1, further comprising:
a third conductor provided in a layer in which the first conductor is provided in a third region included in the first region and provided with the surface protective layer, arranged between the element region and the first conductor in a second direction intersecting the first direction, surrounding the element region, and electrically coupled to a first conductive type region provided in the substrate.

9. The semiconductor device according to claim 8, further comprising:
a fourth conductor provided in a layer in which the first conductor and the third conductor are provided in the third region, arranged between the element region and the third conductor in the second direction, surrounding the element region, and electrically coupled to a second conductive type region provided in the substrate.

10. The semiconductor device according to claim 9, further comprising:
a fifth conductor provided in the third region and in contact with the third conductor and the fourth conductor.

11. The semiconductor device according to claim 10, wherein
the fifth conductor is arranged in a layer in which a sixth conductor used as an external connection terminal is provided.

12. The semiconductor device according to claim 1, wherein
the first semiconductor layer includes:
a fourth semiconductor layer;
a fifth semiconductor layer stacked with the fourth semiconductor layer in the first direction; and
a first insulating layer provided between the fourth semiconductor layer and the fifth semiconductor layer.

13. The semiconductor device according to claim 1, further comprising:
a second insulating layer that covers the first semiconductor layer; and
a third insulating layer provided between the first semiconductor layer and the second insulating layer and containing at least silicon and nitrogen.

14. A semiconductor device comprising:
a first chip including a substrate; and
a second chip bonded to the first chip,
wherein
the substrate includes an element region and a first region surrounding the element region,
the first chip further includes a first electrode pad provided on a surface in contact with the second chip,
the second chip includes:
a surface protective layer provided in the element region and a part of the first region;

a first semiconductor layer at least a part of which is arranged in a second region, the second region being included in the first region and not provided with the surface protective layer;
a first conductor provided in the first region, surrounding the element region, including one end in a first direction in contact with the first semiconductor layer, and including another end electrically coupled to the substrate;
a second electrode pad provided on a surface in contact with the first chip and in contact with the first electrode pad;
a second conductor provided in a layer in which the first conductor is provided in the first region, surrounding the first conductor and the first semiconductor layer, including one end not in contact with the first semiconductor layer, and including another end electrically coupled to the substrate, and
an interconnect layer provided between the second electrode pad and the first and second conductors in the first direction and to which the first conductor and the second conductor are electrically coupled, and
the first conductor is coupled to the substrate via the first electrode pad and the second electrode pad.

15. A semiconductor device comprising:
a substrate including an element region and a first region surrounding the element region;
a surface protective layer provided in the element region and a part of the first region;
a first semiconductor layer at least a part of which is arranged in a second region not provided with the surface protective layer in the first region;
a first conductor provided in the first region, arranged between the substrate and the first semiconductor layer in a first direction, and including one end in contact with the first semiconductor layer;
a second conductor provided in a layer in which the first conductor is provided in the first region, surrounding the element region, the first conductor, and the first semiconductor layer, and not in contact with the first semiconductor layer;
a third conductor provided in a layer in which the first conductor is provided in a third region included in the first region and provided with the surface protective layer, arranged between the element region and the first conductor in a second direction intersecting the first direction, surrounding the element region, and electrically coupled to a first conductive type region provided in the substrate; and
a fourth conductor provided in a layer in which the first conductor and the third conductor are provided in the third region, arranged between the element region and the third conductor in the second direction, surrounding the element region, and electrically coupled to a second conductive type region provided in the substrate,
wherein
the first conductor and the second conductor are electrically coupled to the substrate.

16. The semiconductor device according to claim 15, further comprising:
an interconnect layer provided between the substrate and the first and second conductors in the first direction and to which the first conductor and the second conductor are electrically coupled, wherein the first conductor and the second conductor are electrically coupled to the substrate via the interconnect layer.

17. A semiconductor device comprising:

a first chip comprising a substrate; and a second chip bonded to the first chip on a first surface, the first chip and the second chip including an element region and a ring-shaped region surrounding the element region as viewed in a first direction approximately perpendicular to a surface of the substrate, wherein the first chip comprises:

a first electrode pad arranged at the first surface and having a ring shape continuously surrounding the element region within the ring-shaped region as viewed in the first direction, the first electrode pad being electrically coupled to the substrate, and the second chip comprises:

a second electrode pad arranged at the first surface and having a ring shape continuously surrounding the element region within the ring-shaped region as viewed in the first direction, the second electrode pad being in contact with the first electrode pad;

a first wall structure having a ring shape continuously surrounding the element region within the ring-shaped region as viewed in the first direction, the first wall structure being electrically coupled to the substrate via the second electrode pad and the first electrode pad;

a first interconnect layer arranged between the second electrode pad and the first wall structure in the first direction and coupled to an end of the first wall structure in the first direction via a first conductor; and a second interconnect layer arranged between the second electrode pad and the first interconnect layer in the first direction, coupled to the first interconnect layer via a second conductor, and coupled to the second electrode pad via a third conductor, the second interconnect layer having a width larger than a width of the first interconnect layer.

18. The semiconductor device according to claim 17, wherein the third conductor has a ring shape continuously surrounding the element region within the ring-shaped region as viewed in the first direction.

19. The semiconductor device according to claim 17, wherein the first interconnect layer and the second interconnect layer each have a ring shape continuously surrounding the element region within the ring-shaped region as viewed in the first direction.

20. The semiconductor device according to claim 17, wherein the second chip further comprises a second wall structure separate from the first wall structure and having a ring shape continuously surrounding the element region within the ring-shaped region as viewed in the first direction, the second wall structure being electrically coupled to the substrate.

* * * * *